(12) United States Patent
Mitsuda

(10) Patent No.: US 6,222,403 B1
(45) Date of Patent: Apr. 24, 2001

(54) SLEW RATE OUTPUT CIRCUIT WITH AN IMPROVED DRIVING CAPABILITY OF DRIVING AN OUTPUT MOS FIELD EFFECT TRANSISTOR

(75) Inventor: Tsuyoshi Mitsuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/323,950

(22) Filed: Jun. 2, 1999

(30) Foreign Application Priority Data

Jun. 2, 1998 (JP) ................................................... 10-152624

(51) Int. Cl.[7] .................................................... H03K 17/16
(52) U.S. Cl. ......................... 327/170; 327/109; 327/113; 327/172; 327/263; 327/380; 327/374; 326/26; 326/83
(58) Field of Search ...................................... 327/170, 109, 327/113, 172, 263, 380, 374; 326/26, 83

(56) References Cited

U.S. PATENT DOCUMENTS

| 5,289,051 | | 2/1994 | Zitta . | |
|---|---|---|---|---|
| 5,367,210 | * | 11/1994 | Lipp | 326/26 |
| 5,537,070 | * | 7/1996 | Risinger | 327/170 |
| 5,546,029 | | 8/1996 | Koke . | |
| 5,568,081 | * | 10/1996 | Lui et al. | 327/380 |
| 5,633,600 | | 5/1997 | Ohnishi . | |
| 5,789,955 | * | 8/1998 | Scheraga | 327/170 |
| 5,801,563 | * | 9/1998 | McClure | 327/170 |
| 5,828,245 | * | 10/1998 | Brambilla | 327/108 |
| 5,877,647 | * | 3/1999 | Vajapey et al. | 327/391 |
| 5,887,150 | * | 3/1999 | Schneider et al. | 395/306 |
| 5,939,909 | * | 8/1999 | Callahan, Jr. | 327/108 |

FOREIGN PATENT DOCUMENTS

| 0 368 524 | | 5/1990 | (EP) . |
|---|---|---|---|
| 0 481 544 | | 4/1992 | (EP) . |
| 2-166915 | | 6/1990 | (JP) . |
| 2-309810 | | 12/1990 | (JP) . |
| 5-14167 | | 1/1993 | (JP) . |
| 5-191259 | | 7/1993 | (JP) . |
| 5-206832 | | 8/1993 | (JP) . |
| 6-6195 | | 1/1994 | (JP) . |
| 6-53800 | | 2/1994 | (JP) . |
| 409093111 | * | 4/1997 | (JP) . |
| 11150467 | * | 6/1999 | (JP) . |
| 11-317653 | | 11/1999 | (JP) . |

* cited by examiner

Primary Examiner—Viet Q. Nguyen
(74) Attorney, Agent, or Firm—Young & Thompson

(57) ABSTRACT

A slew rate output circuit includes a switching device connected to an output terminal, a driver circuit connected to the switching device for driving the switching device, and a control circuit connected to the driver circuit for controlling the driver circuit in accordance with an input signal so that, in an initial time period after a change in level of the input signal, the average slew rate is higher than that in a subsequent time period.

26 Claims, 11 Drawing Sheets

SLEW RATE OUTPUT CIRCUIT WITH AN IMPROVED DRIVING CAPABILITY OF DRIVING AN OUTPUT MOS FIELD EFFECT TRANSISTOR

BACKGROUND OF THE INVENTION

The present invention relates to a slew rate output circuit, and more particularly to a slew rate output circuit with an improved driving capability of driving an output MOS field effect transistor in a semiconductor integrated circuit.

In some fields of applications of the semiconductor integrated circuits, the slew rate function may be required. This slew rate function is to prevent rapid ON/OFF switching operations of the output transistor upon variation in voltage level of an input pulse signal, so as to reduce a variation speed of the waveform of the output signal. This slew rate function is capable of preventing appearance of noises on power lines or ground lines of MOS field effect transistor integrated circuits. This slew rate function is also capable of preventing appearances of overshoot and undershoot of the waveforms of the output signals. This slow rate function is also capable of causing drop of a flyback voltage of an inductance load.

FIG. 1 is a circuit diagram illustrative of one of the conventional slew rate output circuit of open drain type for driving an output MOS field effect transistor, wherein the output MOS field effect transistor Q0 has an n-channel type and has a source electrode connected through a load $R_L$ to a power voltage line $V_{dd}$ and a drain electrode connected to a ground line as well as has a gate electrode which is controlled by two constant currents IrH, $I_{rL}$. A Circuit configuration of this conventional open drain type slew rate output circuit for driving an output MOS field effect transistor is as follows.

An output n-channel MOS field effect transistor Q0 is provided to be connected in series between a first power voltage line providing a first power voltage $V_{dd}$ and a ground line providing a ground potential, wherein a source electrode connected through a load $R_L$ to the first power voltage line $V_{dd}$ whilst a drain electrode connected to the ground line. The source electrode of the output n-channel MOS field effect transistor Q0 is connected to an output terminal, so that a voltage of the source is an output voltage Vout and a current through the load $R_L$ is an output current Iout. A series connection of p-channel and n-channel MOS field effect transistors Q1 and Q2 is provided to be connected in series between a second power voltage line providing a second power voltage $V_{cc}$ and the ground line providing the ground potential, wherein the p-channel MOS field effect transistor Q1 is connected through a first constant current source CS1 supplying a first constant current IrH to the second power voltage line providing the second power voltage $V_{cc}$, whilst the n-channel MOS field effect transistor Q2 is connected through a second constant current source CS2 supplying a second constant current IrL to the ground line providing the ground potential. An intermediate point between the p-channel and n-channel MOS field effect transistors Q1 and Q2 is connected to a gate of the above output n-channel MOS field effect transistor Q0. A gate of the p-channel MOS field effect transistor Q1 is connected to an output side of a first invertor I1 which has an input side receiving an input pulse signal Vin so that the input pulse signal Vin is inverted by the first invertor I1 to be entered into the gate of the p-channel MOS field effect transistor Q1, whilst a gate of the n-channel MOS field effect transistor Q2 is connected to an output side of a second invertor I2 which has an input side receiving the above input pulse signal vin so that the input pulse signal Vin is inverted by the second invertor I2 to be entered into the gate of the n-channel MOS field effect transistor Q2.

Operations of the above conventional open drain type slew rate output circuit for driving the output MOS field effect transistor will be described. FIG. 2 is a diagram illustrative of waveforms of the conventional open drain type slew rate output circuit of FIG. 1

When the input pulse signal Vin is changed from a low level to a high level, the high level input pulse signal Vin is inverted by the first and second invertors I1 and I2 and made into the low level gate input signals to be entered into the gates of the p-channel and n-channel MOS field effect transistors Q1 and Q2, so that the p-channel MOS field effect transistor Q1 turns ON, whilst the n-channel MOS field effect transistor Q2 turns OFF, whereby the first constant current IrH is supplied through the first constant current source CS1 to the gate of the output n-channel MOS field effect transistor Q0. As a result, an input capacitance of the output n-channel MOS field effect transistor Q0 is charged so that a gate voltage level of the output n-channel MOS field effect transistor Q0 is gradually risen to the high level until the input capacitance of the output n-channel MOS field effect transistor Q0 is charged up thereby to render the output n-channel MOS field effect transistor Q0 turn ON, whereby the load $R_L$ is made conductive to the ground line and the output voltage level Vout is dropped toward the ground level. In FIG. 2, Vgate means the gate voltage level of the output n-channel MOS field effect transistor Q0.

When the input pulse signal Vin is changed from the high level to the low level, the low level input pulse signal Vin is inverted by the first and second investors I1 and I2 and made into the high level gate input signals to be entered into the gates of the p-channel and n-channel MOS field effect transistors Q1 and Q2, so that the p-channel MOS field effect transistor Q1 turns OFF, whilst the n-channel MOS field effect transistor Q2 turns ON, whereby the second constant current IrL is supplied through the second constant current source CS2 to the gate of the output n-channel MOS field effect transistor Q0. As a result, the input capacitance of the output n-channel MOS field effect transistor Q0 is discharged so that a gate voltage level of the output n-channel MOS field effect transistor Q0 is gradually fallen to the low level until the input capacitance of the output n-channel MOS field effect transistor Q0 is discharged down thereby to render the output n-channel MOS field effect transistor Q0 turn OFF, whereby the load $R_L$ is made non-conductive to the ground line and the output voltage level Vout is risen toward the high level.

A falling time of the output voltage level Vout of the slew rate output circuit depends upon a rising time of the gate voltage of the output n-channel MOS field effect transistor Q0. This rising time of the gate voltage of the output n-channel MOS field effect transistor Q0 further depends upon both the input capacitance of the output n-channel MOS field effect transistor Q0 and the first constant current IrH supplied through the first constant current source CS1. Therefore, the falling time of the output voltage level Vout of the slew rate output circuit or a turn-ON time depends upon both the input capacitance of the output n-channel MOS field effect transistor Q0 and the first constant current IrH supplied through the first constant current source CS1. This means that the falling time of the output voltage level Vout of the slew rate output circuit or the turn-ON time is controllable by controlling both the input capacitance of the output n-channel MOS field effect transistor Q0 and the first constant current IrH supplied through the first constant current source CS1.

A rising time of the output voltage level Vout of the slew rate output circuit depends upon a falling time of the gate voltage of the output n-channel MOS field effect transistor Q0. This falling time of the gate voltage of the output n-channel MOS field effect transistor Q0 further depends upon both the input capacitance of the output n-channel MOS field effect transistor Q0 and the second constant current IrL supplied through the second constant current source CS2. Therefore, the rising time of the output voltage level Vout of the slew rate output circuit or a turn-OFF time depends upon both the input capacitance of the output n-channel MOS field effect transistor Q0 and the second constant current IrL supplied through the second constant current source CS2. This means that the rising time of the output voltage level Vout of the slew rate output circuit or the turn-OFF time is controllable by controlling both the input capacitance of the output n-channel MOS field effect transistor Q0 and the second constant current IrL supplied through the second constant current source CS2.

Since the input capacitance of the output n-channel MOS field effect transistor Q0 provides influences to both the turn-OFF time and turn-ON time of the slew rate output circuit, the turn-ON time of the slew rate output circuit is controllable by controlling the first constant current IrH supplied through the first constant current source CS1, whilst the turn-OFF time of the slew rate output circuit is controllable by controlling the second constant current IrL supplied through the second constant current source CS2, thereby realizing the slew rate function of the conventional slew rate output circuit.

The above conventional slew rate output circuit is, however, engaged with the following problems. The waveform of the output voltage of the conventional slew rate output circuit or the turn-ON time and the turn-OFF time are controlled by the first and second constant currents IrH and IrL supplied through the first and second constant current sources CS1 and CS2 respectively, for which reason the increase in the falling time of the output voltage Vout of the conventional slew rate output circuit necessarily causes an increase in delay time of the turn-ON, whilst the increase in the rising time of the output voltage Vout of the conventional slew rate output circuit necessarily causes an increase in delay time of the turn-OFF time. Those are caused by the facts that if long charge and discharge times of the output n-channel MOS field effect transistor Q0 are set by the first and second constant currents IrH and IrL supplied through the first and second constant current sources CS1 and CS2 respectively, this means that long times are necessary for rendering the gate voltage Vgate of the output n-channel MOS field effect transistor Q0 reach turn-ON and turn-OFF threshold voltages thereof.

The definitions of the delay times in the turn-ON and the turnOFF as well as the slew rate will be described with reference to FIG. 2. The delay time in the turn-ON is defined to be a time tPDr necessary for rendering the output voltage Vout fall down to 90% of the high level from a point of time when the input pulse signal Vin has been changed from the low level to the high level. The delay time in the turn-OFF is defined to be a time tPDf necessary for rendering the output voltage Vout rise up to 10% of the high level from a point of time when the input pulse signal Vin has been changed from the high level to the low level. The slew rate is defined by gradients in rising up and falling down of the waveforms and given by the following formula.

$$SR = \{Vout(90\%) - Vout(10\%)\} / \{T(90\%) - T(10\%)\}$$

where Vout(10%) is 10% level of the high voltage level, Vout(90%) is 90% level of the high voltage level, T(10%) is a point of time when the output voltage level Vout reaches 10% level of the high voltage level, and T(90%) is a point of time when the output voltage level Vout reaches 90% level of the high voltage level.

Whereas the definitions of the delay times in the turn-ON and the turn-OFF as well as the slew rate may alternatively be made on the basis of the output current Iout, in this application, the definitions are made as described above.

In the above circumstances, it had been required to develop a novel slew rate output circuit free from the above problems.

SUMMARY OF THE INVENTION

Accordingly, it is an object of the present invention to provide a novel slew rate output circuit free from the above problems.

It is a further object of the present invention to provide a novel slew rate output circuit which is capable of controlling constant currents for charging or discharging an input capacitance of an output transistor so as to shorten a delay time of an output waveform of a slew rate function.

It is a still further object of the present invention to provide a novel slew rate output circuit which is capable of generating an output waveform free from any influence due to noises appearing in switching values of constant currents for charging or discharging an input capacitance of an output transistor.

The present invention provides a slew rate output circuit comprising: at least a switching device connected to an output terminal; a driver circuitry connected to the switching device for driving the switching device; and a control circuitry connected to the driver circuitry for controlling a driving capability of the driver circuitry in accordance with an input signal so that, in a predetermined time period after transition in level of the input signal has appeared, the driving capability is higher in average than that in a remaining time period.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
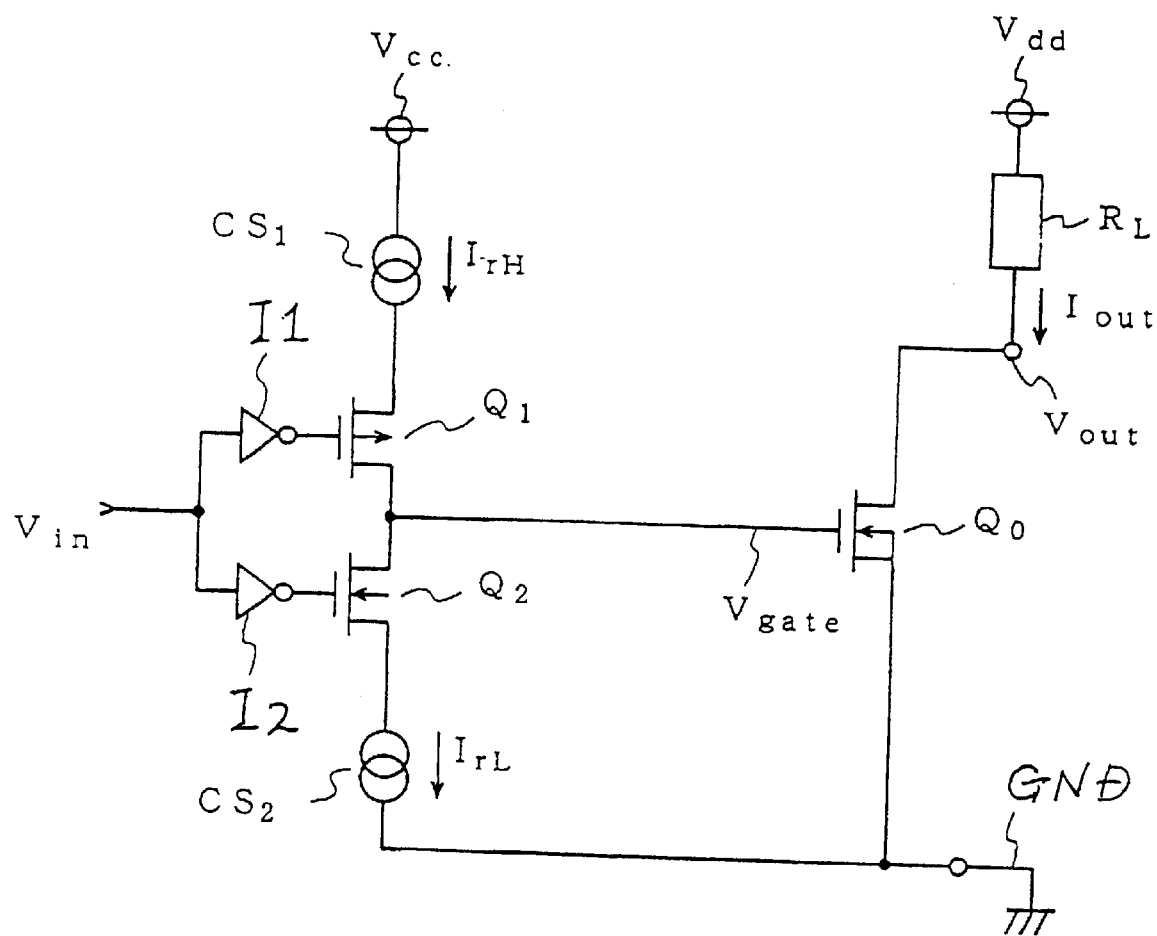
FIG. 1 is a circuit diagram illustrative of one of the conventional slew rate output circuit of open drain type for driving an output MOS field effect transistor, wherein the output MOS field effect transistor Q0 has an n-channel type and has a source electrode connected through a load $R_L$ to a power voltage line $V_{dd}$ and a drain electrode connected to a ground line as well as ha a gate electrode which is controlled by two constant currents IrH, $I_{rL}$.
Figure 2:
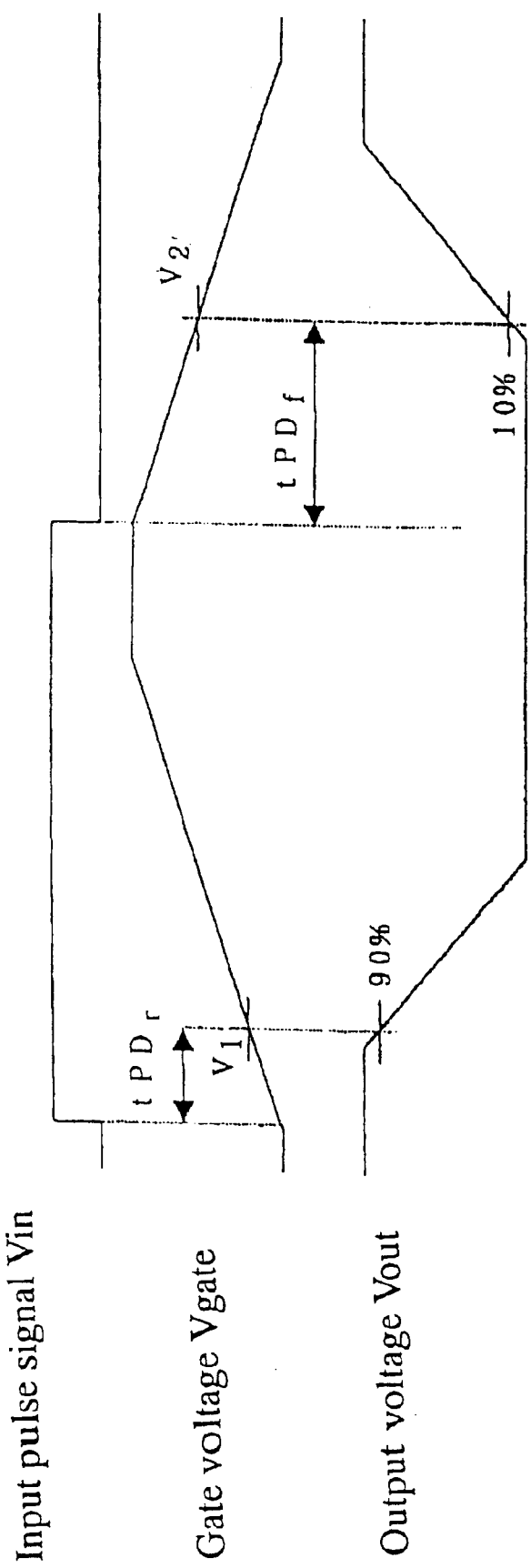
FIG. 2 is a diagram illustrative of waveforms of the conventional open drain type slew rate output circuit of FIG. 1.

The first aspect of the present invention provides a slew rate output circuit that includes a switching device having at least an output field effect transistor and an output terminal; a driver circuitry connected to a gate of the output field effect transistor for driving the output field effect transistor; and a control circuitry connected to the driver circuitry for controlling a driving capability of the driver circuitry in accordance with an input signal so that, in a high speed charge-discharge time period after transition in level of the input signal has appeared, the driving capability is higher in average than that in a remaining time period.

It is preferable that the driver circuitry comprises a first driver performing a first driving capability and a second driver performing a second driving capability, and the control circuitry connected to both the first and second drivers for controlling the first and second drivers so that, in the high speed charge-discharge time period, both the first and second drivers are operated, and in the remaining time period, only the first driver is operated.

It is also preferable that the first driver comprises a first resistance connected in series between an input terminal to which the input signal is applied and the gate of the output field effect transistor, and the second driver comprises a first series connection of a first field effect transistor and a second resistance between a high voltage line and the gate electrode of the output field effect transistor and a second series connection of a second field effect transistor and a third resistance between a low voltage and the gate electrode of the output field effect transistor, and the control circuitry controls the first and second field effect transistors so that the first field effect transistor is activated for turning the output field effect transistor OFF whilst the second field effect transistor is activated for turning the output field effect transistor ON.

It is further preferable that the control circuitry comprises a first control circuit connected between the input terminal and a gate of the first field effect transistor for controlling activation of the first field effect transistor and a second control circuit connected between the input terminal and a gate of the second field effect transistor for controlling activation of the second field effect transistor.

It is furthermore preferable that the first control circuit comprises a first delay circuit having an input side connected to the input terminal and an AND-gate having input sides connected to the input terminal and an output side of the delay circuit for performing an AND-operation of the input signal and a first delay signal from the first delay circuit, and the second control circuit comprises a second delay circuit having an input side connected to the input terminal and an OR-gate having input sides connected to the input terminal and an output side of the delay circuit for performing an OR-operation of the input signal and a second delay signal from the second delay circuit.

It is also preferable that the first and second drivers comprise first and second constant current sources respectively and the control circuitry comprises a first field effect transistor connected in series between the first constant current source and the gate of the output field effect transistor, and a second field effect transistor connected in series between the second constant current source and the first field effect transistor so that the first field effect transistor controls a junction current of a first constant current through the first constant current source and a second constant current through the second constant current source and the second field effect transistor controls the second constant current.

It is further preferable that the first and second constant current sources form a current mirror circuit.

It is furthermore preferable that control of the second field effect transistor is made by detecting a first current value corresponding to 1–10 percent of an amplification of a drain current of the output field effect transistor for turning the output field effect transistor ON, and detecting a second current value corresponding to 90–99 percent of the amplification of the drain current of the output field effect transistor for turning the output field effect transistor OFF.

It is furthermore preferable that the second field effect transistor has a gate connected to an output side of a comparator having a first input connected to the gate of the output field effect transistor for receiving a gate voltage of the output field effect transistor and a second input for receiving a reference voltage so as to perform a comparison of the gate voltage with the reference voltage so that the second field effect transistor is controlled by a comparison signal from the comparator.

It is moreover preferable that control of the second field effect transistor is made by detecting a small current proportional to a drain current of the output field effect transistor and comparison of a voltage proportional to the small current and the reference voltage, and also comparison of the small current and a reference current.

It is still more preferable that the reference voltage is set to be a gate voltage level necessary for flowing a drain current corresponding to 1–10 percent of an amplification of the drain current of the output field effect transistor for turning the output field effect transistor ON, and to be a gate voltage level necessary for flowing a drain current corresponding to 1–10 percent of an amplification of the drain current of the output field effect transistor for turning the output field effect transistor OFF.

It is also preferable that the switching device comprises a single output field effect transistor having a drain connected through a load to a power voltage line and a source connected to a ground line.

It is also preferable that the switching device comprises a complementary MOS circuit which further comprises a p-channel MOS field effect transistor having a source connected to a power voltage line and an n-channel MOS field effect transistor having a source connected to a ground line and the output terminal is connected to both drains of the p-channel and n-channel MOS field effect transistors.

The second aspect of the present invention provides a slew rate output circuit having at least a switching device connected to an output terminal; a driver circuitry connected to the switching device for driving the switching device; and a control circuitry connected to the driver circuitry for controlling a driving capability of the driver circuitry in accordance with an input signal so that, in a predetermined time period after transition in level of the input signal has appeared, the driving capability is higher in average than that in a remaining time period.

It is preferable that the driver circuitry comprises a first driver performing a first driving capability and a second driver performing a second driving capability, and the control circuitry connected to both the first and second drivers for controlling the first and second drivers so that, in the predetermined time period, both the first and second drivers are operated, and in the remaining time period, only the first driver is operated.

It is further preferable that the first driver comprises a first resistance connected in series between the switching device and an input terminal to which the input signal is applied, and the second driver comprises a first series connection of a first field effect transistor and a second resistance between a high voltage line and the switching device and a second series connection of a second field effect transistor and a third resistance between a low voltage and the switching device, and the control circuitry controls the first and second field effect transistors so that the first field effect transistor is activated for turning the switching device OFF whilst the second field effect transistor is activated for turning the switching device ON.

It is furthermore preferable that the control circuitry comprises a first control circuit connected between the input terminal and a gate of the first field effect transistor for controlling activation of the first field effect transistor and a second control circuit connected between the input terminal and a gate of the second field effect transistor for controlling activation of the second field effect transistor.

It is moreover preferable that the first control circuit comprises a first delay circuit having an input side connected to the input terminal and an AND-gate having input sides connected to the input terminal and an output side of the delay circuit for performing an AND-operation of the input signal and a first delay signal from the first delay circuit, and the second control circuit comprises a second delay circuit having an input side connected to the input terminal and an OR-gate having input sides connected to the input terminal and an output side of the delay circuit for performing an OR-operation of the input signal and a second delay signal from the second delay circuit.

It is still more preferable that the first and second drivers comprise first and second constant current sources respectively and the control circuitry comprises a first field effect transistor connected in series between the first constant current source and the switching device, and a second field effect transistor connected in series between the second constant current source and the first field effect transistor so that the first field effect transistor controls a junction current of a first constant current through the first constant current source and a second constant current through the second constant current source and the second field effect transistor controls the second constant current.

It is moreover preferable that the first and second constant current sources form a current mirror circuit.

It is also preferable that control to the second field effect transistor is made by detecting a first current value corresponding to 1–10 percents of an amplification of a switching current of the switching device for turning the switching device ON, and detecting a second current value corresponding to 90–99 percents of the amplification of the switching current of the switching device for turning the switching device OFF.

It is also preferable that the second field effect transistor has a gate connected to an output side of a comparator having a first input connected to the switching device for receiving a switching voltage of the switching device and a second input for receiving a reference voltage so as to perform a comparison of the switching voltage with the reference voltage so that the second field effect transistor is controlled by a comparison signal from the comparator.

It is further preferable that control to the second field effect transistor is made by detecting a small current proportional to a switching current of the switching device and comparison of a voltage proportional to the small current and the reference voltage, and also comparison of the small current and a reference current.

It is also preferable that the reference voltage is set to be a switching voltage level necessary for flowing a switching current corresponding to 1–10 percents of an amplification of the switching current of the switching device for turning the switching device ON, and to be a switching voltage level necessary for flowing a switching current corresponding to 1–10 percents of an amplification of the switching current of the switching device for turning the switching device OFF.

It is also preferable that the switching device comprises a single output field effect transistor having a drain connected through a load to a power voltage line and a source connected to a ground line.

It is also preferable that the switching device comprises a complementary MOS circuit which further comprises a p-channel MOS field effect transistor having a source connected to a power voltage line and an n-channel MOS field effect transistor having a source connected to a ground line and the output terminal is connected to both drains of the p-channel and n-channel MOS field effect transistors.

Figure 3:
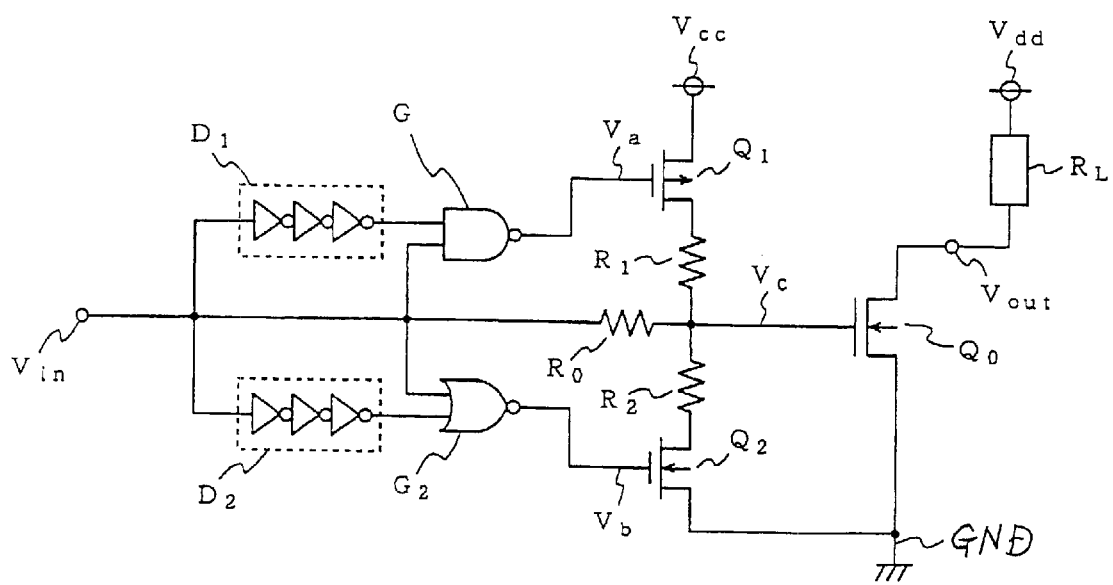
FIG. 3 is a circuit diagram illustrative of a first novel open-drain type slew rate output circuit in a first embodiment in accordance with the present invention.

A first embodiment according to the present invention will be described in detail with reference to the drawings. FIG. 3 is a circuit diagram illustrative of a first novel open-drain type slew rate output circuit. The first novel slew rate output circuit has an n-channel output MOS field effect transistor Q0 connected in series between a ground line and an output terminal on which an output signal Vout appears. A load RL is also connected between the output terminal and a first power voltage line Vdd. Namely, the load RL and the n-channel output MOS field effect transistor Q0 are connected in series between the first power voltage line Vdd and the ground line, and the output terminal is connected between the load RL and the n-channel output MOS field effect transistor Q0. A source of the n-channel output MOS field effect transistor Q0 is connected to the ground line, whilst a drain of the n-channel output MOS field effect transistor Q0 is connected to the output terminal which is further connected through the load RL to the first power voltage line Vdd.

The first novel slew rate output circuit also has a first driver circuit performing a first driving capability and a second driver circuit performing a second driving capability, as well as a first control circuit connected to the first driver circuit for controlling the first driver circuit and a second control circuit connected to the second driver circuit for controlling the second driver circuit so that, in a predetermined time period, both the first and second driver circuits are operated, and in the remaining time period, only the first driver circuit is operated. The first driver circuit comprises a first resistance R0 connected in series between a gate of the n-channel output MOS field effect transistor Q0 and an input terminal to which an input pulse signal Vin is applied. The second driver circuit comprises a first series connection of a first p-channel MOS field effect transistor Q1 and a second resistance R1 between a second power voltage line Vcc and the gate of the n-channel output MOS field effect transistor Q0, and a second series connection of a second n-channel MOS field effect transistor Q2 and a third resistance R2 between the ground line and the gate of the n-channel output MOS field effect transistor Q0. The first and second control circuits do control the first p-channel and second n-channel MOS field effect transistors Q1 and Q2 respectively so that the first p-channel field effect transistor Q1 is activated or turns ON for turning the n-channel output MOS field effect transistor Q0 OFF whilst the second n-channel MOS field effect transistor Q2 is activated or turns ON for turning the n-channel output MOS field effect transistor Q0 ON. The first control circuit is connected between the input terminal and a gate of the first p-channel field effect transistor Q1 for controlling ON-OFF operations of the first p-channel MOS field effect transistor Q1. The second control circuit is connected between the input terminal and a gate of the second n-channel MOS field effect transistor Q2 for controlling ON-OFF operations of the second n-channel MOS field effect transistor Q2. The first control circuit comprises a first delay circuit D1 having an input side connected to the input terminal and a NAND-gate G1 having input sides connected to the input terminal and connected to an output side of the first delay circuit D1 for performing a NAND-operation of the input signal and a first delay signal from the first delay circuit D1. The second control circuit comprises a second delay circuit D2 having an input side connected to the input terminal and a NOR-gate G2 having input sides connected to the input terminal and connected to an output side of the second delay circuit for performing a NOR-operation of the input signal and a second delay signal from the second delay circuit D2.

The above first novel slew rate output circuit allows that the n-channel output MOS field effect transistor Q0 amplifies and inverts the input pulse signal Vin for subsequent supplying the same to the load RL, wherein the transition in level of the input pulse signal Vin is detected so that in the predetermined time period from the transition in level of the input pulse signal Vin, both the first driver circuit and the second driver circuit are operated to drive the n-channel output MOS field effect transistor Q0, wherein not only the first resistance R0 bit also either the second or third resistance R1 or R2 are used to drive the n-channel output MOS field effect transistor Q0. In the remaining time period, only the first driver circuit is operated to drive the n-channel output MOS field effect transistor Q0.

In operation of turning the n-channel output MOS field effect transistor Q0 ON, the first delay circuit D1 delays the input pulse signal Vin by a predetermined time period to generate a first delay signal which is to be inputted into one input terminal of the NAND gate G1. The NAND gate G1 receives both the first delay signal from the first delay circuit D1 and the input pulse signal Vin for performing the NAND operations of those signals to generate a first logic output signal Va which is inputted into the gate of the first p-channel MOS field effect transistor Q1.

In operation of turning the n-channel output MOS field effect transistor Q0 OFF, the second delay circuit D2 delays the input pulse signal Vin by a predetermined time period to generate a second delay signal which is to be inputted into one input terminal of the NOR gate G2. The NOR gate G2 receives both the second delay signal from the second delay circuit D2 and the input pulse signal Vin for performing the NOR operations of those signals to generate a second logic output signal Vb which is inputted into the gate of the second n-channel MOS field effect transistor Q2.

Figure 4:
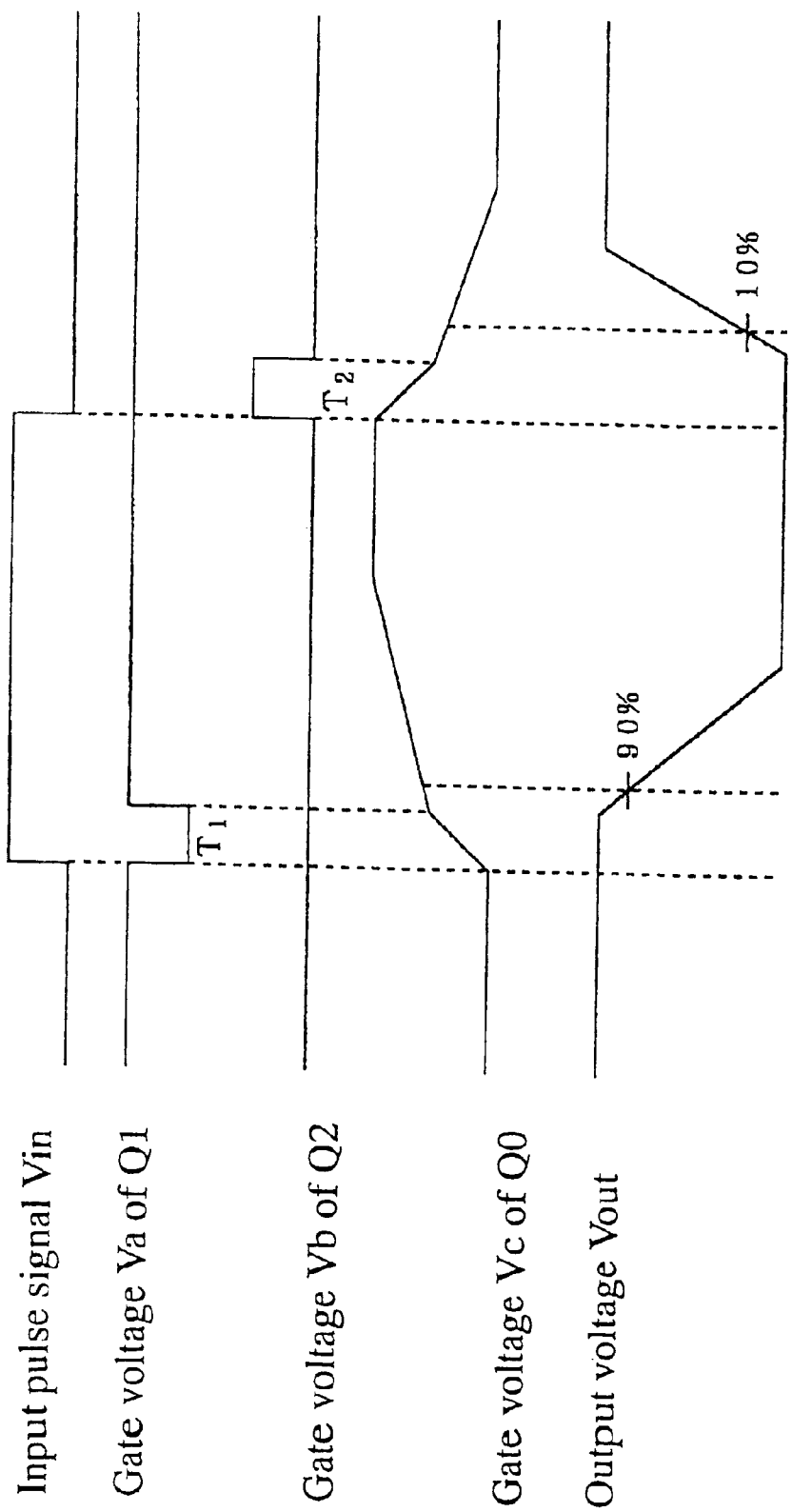
FIG. 4 is a timing chart illustrative of waveforms of an input pulse signal Vin, a gate voltage level Va of a first p-channel MOS field effect transistor of a second driver circuit, a gate voltage level Vb of a second n-channel MOS field effect transistor of the second driver circuit, a gate voltage level Vc of an output n-channel MOS field effect transistor, and an output voltage Vout appearing on an output terminal of the novel first slew rate output circuit of FIG. 3.

The following descriptions will highlight operations of the above novel first slow rate output circuit. FIG. 4 is a timing chart illustrative of waveforms of an input pulse signal Vin, a gate voltage level Va of a first p-channel MOS field effect transistor of a second driver circuit, a gate voltage level Vb of a second n-channel MOS field effect transistor of the second driver circuit, a gate voltage level Vc of an output n-channel MOS field effect transistor, and an output voltage Vout appearing on an output terminal of the novel first slew rate output circuit.

During when the input pulse signal Vin is in the low level, the output n-channel MOS field effect transistor Q0 is in the OFF state, whereby no current flows the load RL and the output voltage Vout is defined by the first power voltage Vdd of the first power voltage line. Meanwhile, the p-channel MOS field effect transistor Q1 and the n-channel MOS field effect transistor Q2 are also in the OFF state for the following reasons.

When a transition in voltage level from the low level to the high level appears on the input pulse signal Vin, the first delay circuit D1 and the NAND-gate G1 controls the first p-channel MOS field effect transistor Q1 so that the gate voltage Va of the first p-channel MOS field effect transistor Q1 becomes low level but only in a first predetermined time period "T1" from the transition in voltage level from the low level to the high level of the input pulse signal Vin as illustrated in FIG. 4, wherein the a first predetermined time period "T1" corresponds to a first delay time of the first delay circuit D1. Therefore, the first p-channel MOS field effect transistor Q1 having the source connected to the second power voltage line $V_{cc}$ turns ON but only in the first predetermined time period "T1", thereby driving the gate of the output n-channel MOS field effect transistor Q0 through the second resistance R1. As a result, only in the first predetermined time period "T1", the gate of the output n-channel MOS field effect transistor Q0 is driven by not only the input pulse signal Vin having transmitted through the first resistance R0 but also the drain voltage of the first p-channel MOS field effect transistor Q1 having supplied through the second resistance R1. A gradient of rising a gate voltage Vgate of the output n-channel MOS field effect transistor Q0 becomes enlarged, whereby a charge speed of the input capacitance of the output n-channel MOS field effect transistor Q0 is also high, for which reason a delay time for falling down the output voltage Vout is shortened.

After the time has passed the predetermined time period "T1", however, the gate voltage of the p-channel MOS field effect transistor Q1 becomes high level, whereby the p-channel MOS field effect transistor Q1 turns OFF and no current flow through the second resistance R1. As a result, the gate of the output n-channel MOS field effect transistor Q0 is driven by but only the input pulse signal Vin having transmitted through the first resistance R0, for which reason the gradient of falling down the output voltage level Vout becomes gentle, whereby the required slew rate function is performed by the above slew rate output circuit.

When the transition in level of the input pulse signal Vin from the high level to the low level appears, the second delay circuit D2 and the NOR-gate G2 controls the second n-channel MOS field effect transistor Q2 so that the gate voltage Vb of the second n-channel MOS field effect transistor Q2 becomes low level but only in a second predetermined time period "T2" from the transition in voltage level from the low level to the high level of the input pulse signal Vin as illustrated in FIG. 4, wherein the a second predetermined time period "T2" corresponds to a second delay time of the second delay circuit D2. Therefore, the second n-channel MOS field effect transistor Q2 having the source connected to the ground line turns ON but only in the second predetermined time period "T2", thereby driving the gate of the output n-channel MOS field effect transistor Q0 through the third resistance R2. As a result, only in the second predetermined time period "T2", the gate of the output n-channel MOS field effect transistor Q0 is driven by not only the input pulse signal Vin having transmitted through the first resistance R0 but also the drain voltage of the second n-channel MOS field effect transistor Q2 having supplied through the third resistance R2. A gradient of rising a gate voltage Vgate of the output n-channel MOS field effect transistor Q0 becomes enlarged, whereby a charge speed of the input capacitance of the output n-channel MOS field effect transistor Q0 is also high, for which reason a delay time for falling down the output voltage Vout is shortened.

After the time has passed the second predetermined time period "T2", however, the gate voltage of the n-channel MOS field effect transistor Q2 becomes low level, whereby the n-channel MOS field effect transistor Q2 turns OFF and no current flow through the third resistance R2. As a result, the gate of the output n-channel MOS field effect transistor Q0 is driven by but only the input pulse signal Vin having transmitted through the first resistance R0, for which reason the gradient of falling down the output voltage level Vout becomes gentle, whereby the required slew rate function is performed by the above slew rate output circuit.

If, differently from the present invention, the input capacitance on the gate of the output n-channel MOS field effect transistor Q0 is driven by a low impedance driver in order to shorten the delay time, then the following problems will appear. An abrupt change in gate voltage level of the output n-channel MOS field effect transistor Q0 is likely to generate noises. If variations in driving capability and voltage level of the low impedance driver appear, a large variation in output voltage level of the output n-channel MOS field effect transistor Q0 is caused by switching the driver, whereby the output voltage waveform may discontinuously be varied.

By contrast, in accordance with the present invention, the input capacitance on the gate of the output n-channel MOS field effect transistor Q0 is driven by a high impedance driver, for example, the first, second and third resistances R0, R1 and R2 in order to shorten the delay time. A gentle change in gate voltage level of the output n-channel MOS field effect transistor Q0 is unlikely to generate noises. If variations in driving capability and voltage level of the high impedance driver appear, a small variation in output voltage level of the output n-channel MOS field effect transistor Q0 is caused by switching the driver, whereby the discontinuity of the output voltage waveform may be suppressed.

In accordance with the present invention, during the predetermined time period after the transition in voltage level of the input pule signal has appeared, the driving capability of the output n-channel MOS field effect transistor Q0 is set high to shorten the delay times for turning the output n-channel MOS field effect transistor Q0 ON or OFF, and further after the time has passed the predetermined time period, the driving capability of the output n-channel MOS field effect transistor Q0 is set low to relax the rising and falling times of the output waveform, whereby the required slew rate function can be obtained.

Further, in accordance with the present invention, the driving capability is switched from the high level to the low level before the output n-channel MOS field effect transistor Q0 turns ON, so that there can be obtained the output waveform free from substantially no noise due to the switching the driving capability.

Figure 5:
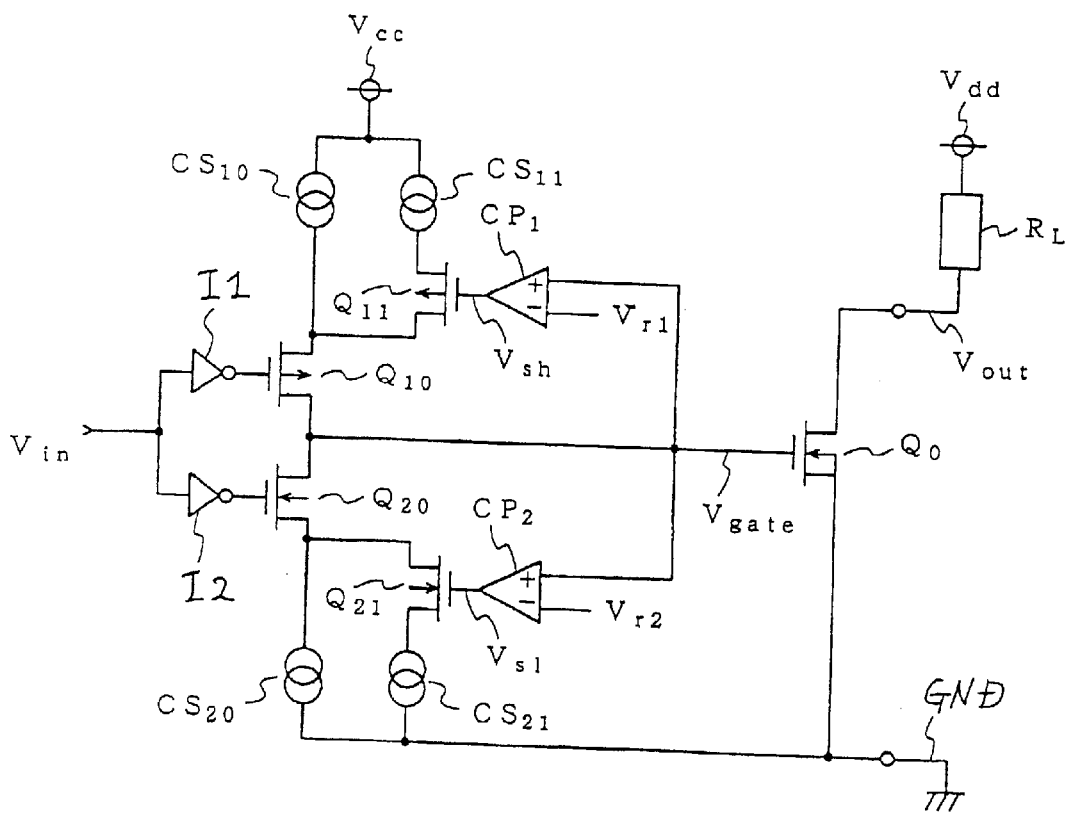
FIG. 5 is a circuit diagram illustrative of a second novel open-drain type slew rate output circuit in a second embodiment in accordance with the present invention.

A second embodiment according to the present invention will be described in detail with reference to the drawings. FIG. 5 is a circuit diagram illustrative of a second novel open-drain type slew rate output circuit. The second novel slew rate output circuit has an n-channel output MOS field effect transistor Q0 connected in series between a ground line and an output terminal on which an output signal Vout appears. A load RL is also connected between the output terminal and a first power voltage line Vdd. Namely, the load RL and the n-channel output MOS field effect transistor Q0 are connected in series between the first power voltage line Vdd and the ground line, and the output terminal is connected between the load RL and the n-channel output MOS field effect transistor Q0. A source of the n-channel output MOS field effect transistor Q0 is connected to the ground line, whilst a drain of the n-channel output MOS field effect transistor Q0 is connected to the output terminal which is further connected through the load RL to the first power voltage line Vdd.

The second novel slew rate output circuit also has a first driver circuit performing a first driving capability and a second driver circuit performing a second driving capability, as well as a first control circuit connected to the first driver circuit for controlling the first driver circuit and a second control circuit connected to the second driver circuit for controlling the second driver circuit so that, in a predetermined time period, both the first and second driver circuits are operated, and in the remaining time period, only the first driver circuit is operated. The first driver circuit comprises a first series connection of a first constant current source CS10 for supplying a first constant current and a first p-channel MOS field effect transistor Q10 between a second power voltage line Vcc and a gate of the output n-channel MOS field effect transistor Q0 as well as a second series connection of a second constant current source CS20 for supplying a second constant current and a second n-channel MOS field effect transistor Q20 between the ground line and the gate of the output n-channel MOS field effect transistor Q0. The second driver circuit comprises a third series connection of a third constant current source CS11 for supplying a third constant current, a third p-channel MOS field effect transistor Q11 and the first p-channel MOS field effect transistor Q10 between the second power voltage line Vcc and the gate of the output n-channel MOS field effect transistor Q0 as well as a fourth series connection of a fourth constant current source CS21 for supplying a second constant current, a fourth n-channel MOS field effect transistor Q21 and the second n-channel MOS field effect transistor Q20 between the ground line and the gate of the output n-channel MOS field effect transistor Q0. The first and second control circuits do control the first p-channel, second n-channel, third p-channel and fourth n-channel MOS field effect transistors Q10, Q20, Q11 and Q21. The first control circuit is connected between the input terminal and gates of the first p-channel and second n-channel MOS field effect transistors Q10 and Q20 for controlling ON-OFF operations of the first p-channel and second n-channel MOS field effect transistors Q10 and Q20. The second control circuit is connected between the gate of the output n-channel MOS field effect transistor Q0 and gates of the third p-channel and fourth n-channel MOS field effect transistors Q11 and Q21 for controlling ON-OFF operations of the third p-channel and fourth n-channel MOS field effect transistors Q11 and Q21. The first control circuit comprises a first invertor circuit I1 having an input side connected to the input terminal and an output side connected to the gate of the first p-channel MOS field effect transistor Q10 and a second invertor circuit I2 having an input side connected to the input terminal and an output side connected to the gate of the second n-channel MOS field effect transistor Q20. The second control circuit comprises a first comparator CP1 having a first input connected to the gate of the output n-channel MOS field effect transistor Q0 and a second input receiving a first reference voltage Vr1 and an output connected to a gate of the third p-channel MOS field effect transistor Q11 for controlling the ON-OFF operations of the third p-channel MOS field effect transistor Q11 in accordance with a first comparison signal Vsh from the first comparator CP1 as well as a second comparator CP2 having a first input connected to the gate of the output n-channel MOS field effect transistor Q0 and a second input receiving a second reference voltage Vr2 and an output connected to a gate of the fourth n-channel MOS field effect transistor Q21 for controlling the ON-OFF operations of the third n-channel MOS field effect transistor Q21 in accordance with a second comparison signal Vsl from the second comparator CP2.

Figure 6:
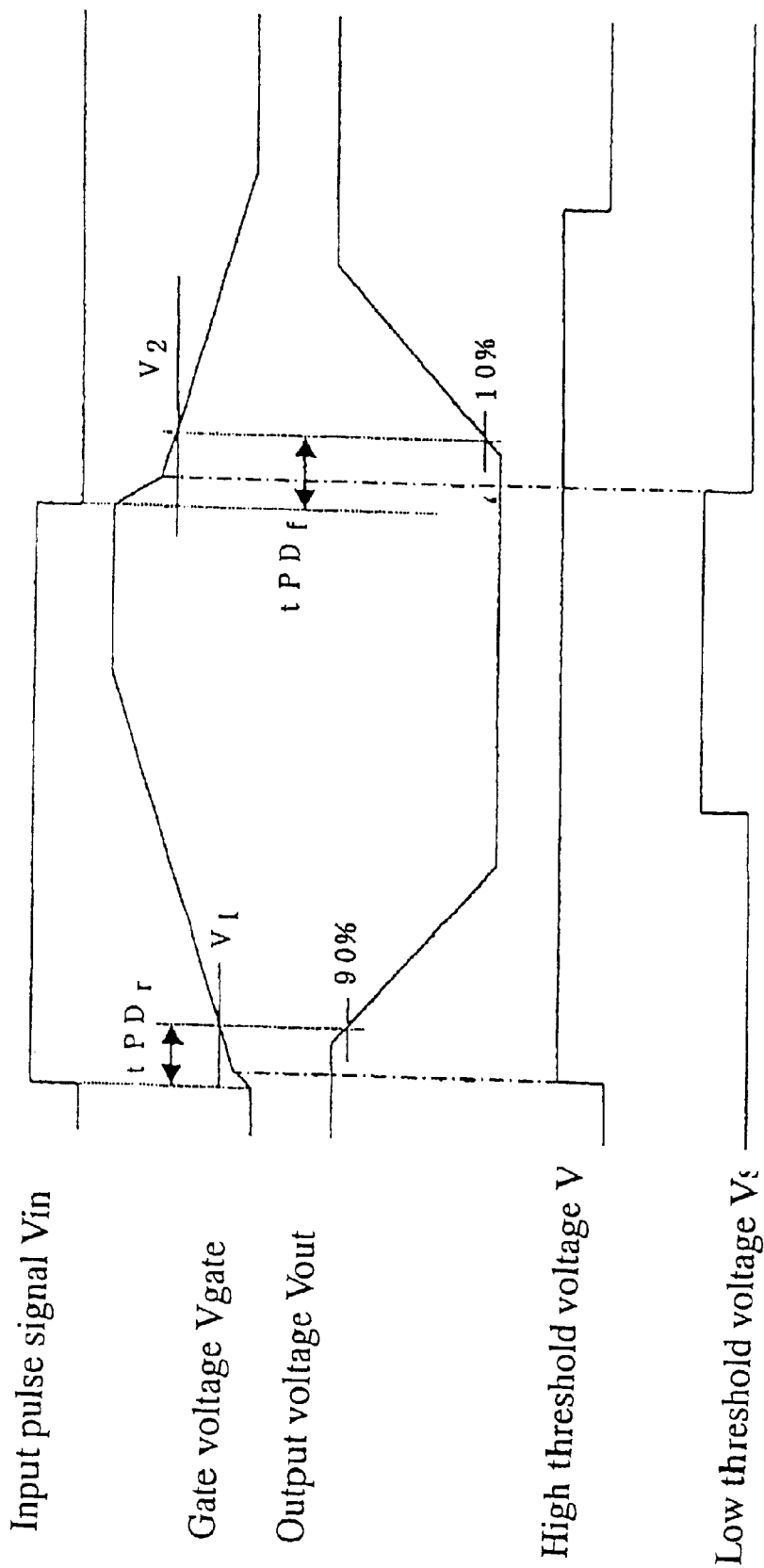
FIG. 6 is a timing chart illustrative of waveforms of an input pulse signal Vin, a gate voltage level Vgate of the output n-channel MOS field effect transistor Q0, an output voltage Vout of the second novel slew rate circuit, a high threshold voltage Vsh as a first comparison signal from the first comparator CP1 and a low threshold voltage Vsl as a second comparison signal from the second comparator CP2 of the second novel slew rate circuit of FIG. 5.

In accordance with the above second novel slew rate output circuit, the output n-channel MOS field effect transistor Q0 is driven by the contact currents, wherein the switching to the driving capability to the output n-channel MOS field effect transistor Q0 is made by monitoring the gate voltage level of the output n-channel MOS field effect transistor Q0. FIG. 6 is a timing chart illustrative of waveforms of an input pulse signal Vin, a gate voltage level Vgate of the output n-channel MOS field effect transistor Q0, an output voltage Vout of the second novel slew rate circuit, a high threshold voltage Vsh as a first comparison signal from the first comparator CP1 and a low threshold voltage Vsl as a second comparison signal from the second comparator CP2. The first comparator CP1 compares the gate voltage Vgate of the output n-channel MOS field effect transistor Q0 with the first reference voltage Vr1, so that if the gate voltage Vgate of the output n-channel MOS field effect transistor Q0 is lower than the first reference voltage Vr1, then the first comparison signal as the high threshold voltage signal Vsh becomes low level, whereby the third p-channel MOS field effect transistor Q11 turns ON. If the gate voltage Vgate of the output n-channel MOS field effect transistor Q0 is higher than the first reference voltage Vr1, then the first comparison signal as the high threshold voltage signal Vsh becomes high level, whereby tie third p-channel MOS field effect transistor Q11 turns OFF. The second comparator CP2 compares the gate voltage Vgate of the output n-channel MOS field effect transistor Q0 with the second reference voltage Vr2, so that if the gate voltage Vgate of the output n-channel MOS field effect transistor Q0 is lower than the second reference voltage Vr2, then the second comparison signal as the low threshold voltage signal Vsl becomes low level, whereby the fourth n-channel MOS field effect transistor Q21 turns OFF. If the gate voltage Vgate of the output n-channel MOS field effect transistor Q0 is higher than the second reference voltage Vr2, then the second comparison signal as the low threshold voltage signal Vsl becomes high level, whereby the fourth n-channel MOS field effect transistor Q21 turns ON. If the third p-channel MOS field effect transistor Q11 is in the ON-state and the first p-channel MOS field effect transistor Q10 is in the OFF-state, then the third constant current through the third constant current source CS11 does not flow through the first p-channel MOS field effect transistor Q10 to the gate of the output n-channel MOS field effect transistor Q0. If the fourth n-channel MOS field effect transistor Q21 is in the ON-state and the second n-channel MOS field effect transistor Q20 is in the OFF-state, then the fourth constant current through the fourth constant current source CS21 does not flow through the second n-channel MOS field effect transistor Q20 to the gate of the output n-channel MOS field effect transistor Q0.

When the transition of the input pulse signal Vin from the low level to the high level appears, the first p-channel MOS field effect transistor Q10 turns ON. The third p-channel MOS field effect transistor Q11 has already remained in the ON-state. The input capacitance of the output n-channel MOS field effect transistor Q0 is rapidly charged by both the first constant current through the first constant current source CS10 and the third constant current through the third constant current source CS11. The gate voltage level Vgate of the output n-channel MOS field effect transistor Q0 is increased so that the gate voltage level Vgate becomes higher than the first reference voltage level Vr1. The first comparison signal as the high threshold voltage signal Vsh from the first comparator CP1 becomes high level, whereby the third p-channel MOS field effect transistor Q11 turns OFF whilst the first p-channel MOS field effect transistor Q10 still remains ON-state. As a result, the output n-channel MOS field effect transistor Q0 is driven by only the first constant current through the first constant current source CS10 and the first p-channel MOS field effect transistor Q10.

When the transition of the input pulse signal Vin from the high level to the low level appears, the second n-channel MOS field effect transistor Q20 turns ON. The fourth n-channel MOS field effect transistor Q21 has already remained in the ON-state. The input capacitance of the output n-channel MOS field effect transistor Q0 is rapidly discharged by both the second constant current through the second constant current source CS20 and the fourth constant current through the fourth constant current source CS21. The gate voltage level Vgate of the output n-channel MOS field effect transistor Q0 is decreased so that the gate voltage level Vgate becomes lower than the second reference voltage level Vr2. The second comparison signal as the low threshold voltage signal Vs1 from the second comparator CP2 becomes low level, whereby the fourth n-channel MOS field effect transistor Q21 turns OFF whilst the second n-channel MOS field effect transistor Q20 still remains ON-state. As a result, the output n-channel MOS field effect transistor Q0 is driven by only the second constant current through the second constant current source CS20 and the second n-channel MOS field effect transistor Q20.

The above second novel slew rate output circuit is capable of shortening the delay times and relaxing the rising time and falling time. The delay time for turning the output n-channel MOS field effect transistor Q0 OFF corresponds to a time period tPDr defined until a time point when the output voltage Vout drops down to 90% level of the high level from the input pulse signal Vin is switched from the low level to the high level. The delay time for turning the output n-channel MOS field effect transistor Q0 ON corresponds to a time period tPDf defined until a time point when the output voltage Vout rises up to 10% level of the high level from the input pulse signal Vin is switched from the high level to the low level.

Figure 7:
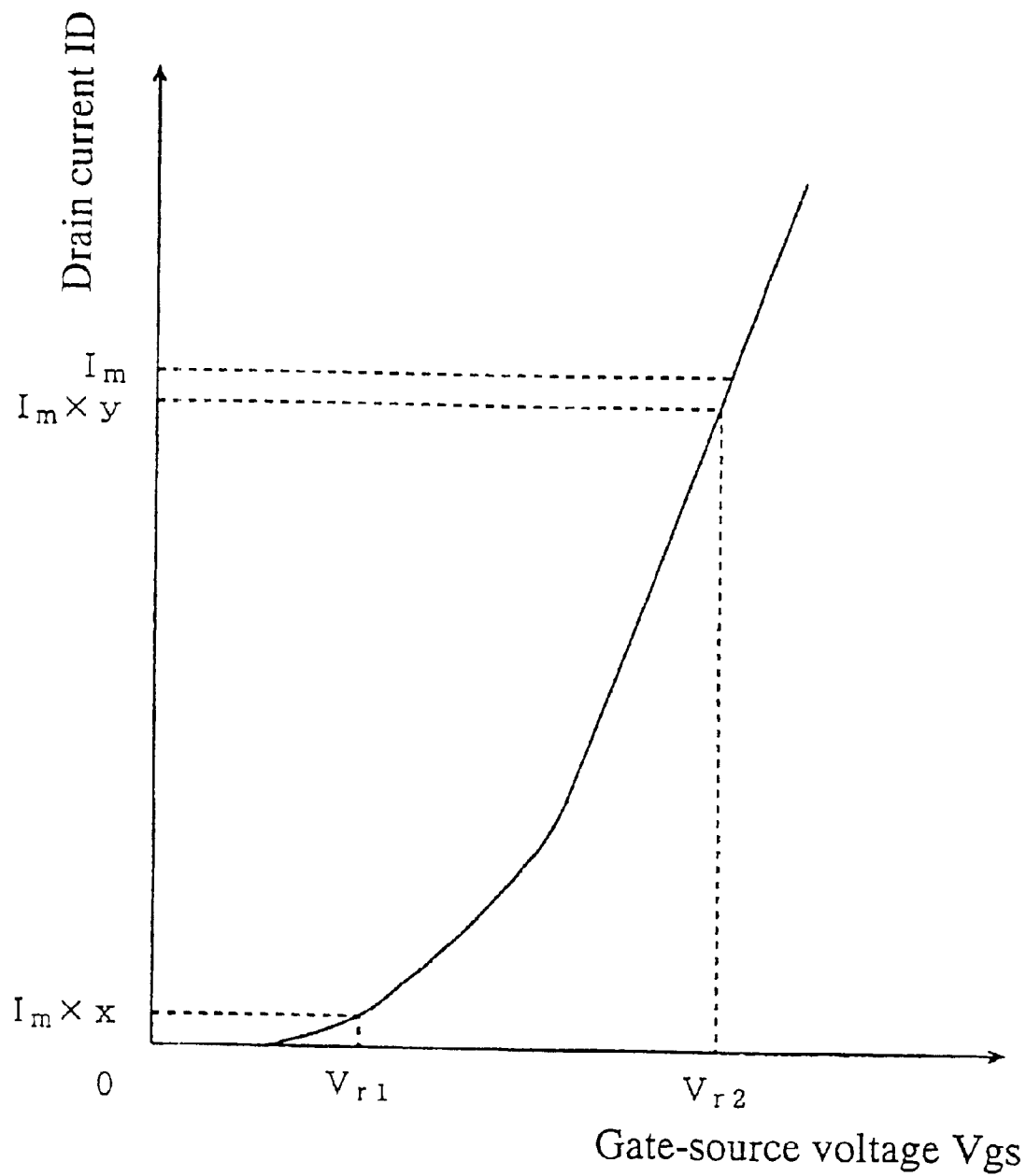
FIG. 7 is a diagram illustrative of a variation in drain current of the output n-channel MOS field effect transistor Q0 over gate-source voltage level of the output n-channel MOS field effect transistor Q0 to show relationship between the drain current and the first and second reference voltage levels Vr1 and Vr2 in the above second novel slew rate output circuit of FIG. 5.

FIG. 7 is a diagram illustrative of a variation in drain current of the output n-channel MOS field effect transistor Q0 over gate-source voltage level of the output n-channel MOS field effect transistor Q0 to show relationship between the drain current and the first and second reference voltage levels Vr1 and Vr2 in the above second novel slew rate output circuit of FIG. 5. If a current Iout flowing through the load RL in turning the output n-channel MOS field effect transistor Q0 ON is defined to be Im (100%), then the reference voltage Vr1 is given by Im×X. If "X" becomes small, then the delay time becomes long. If "X" becomes large, then a variation of the output current of the output n-channel MOS field effect transistor Q0 in ON-OFF switching becomes large. In order to shorten the delay time and also suppress the variation in output current of the n-channel MOS field effect transistor Q0 within 10% in the ON-OFF switching of the third p-channel MOS field effect transistor Q11, it is required that "X" is in the range of 1–10%, preferably 1–5%.

Figure 8:
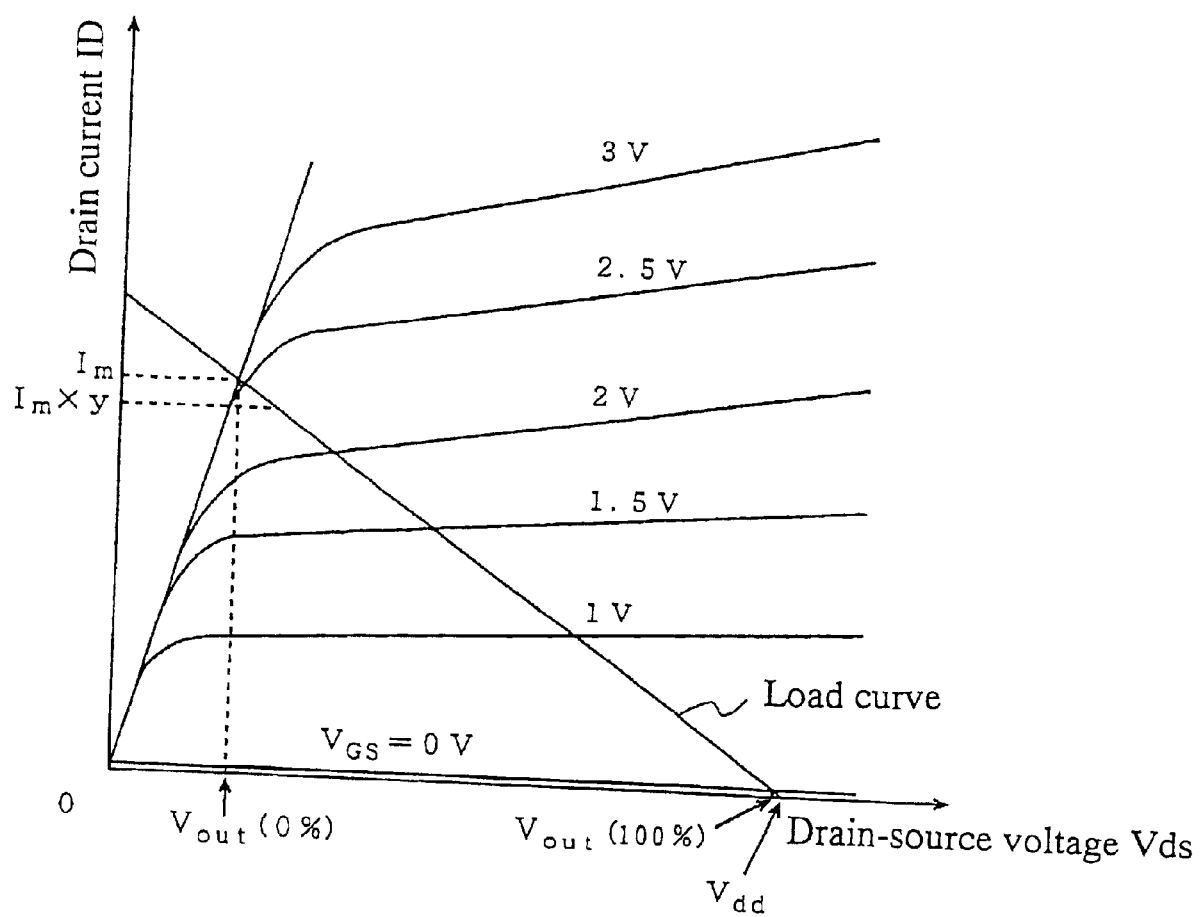
FIG. 8 is a diagram illustrative of a drain current ID of the n-channel MOS field effect transistor Q0 over a drain voltage VDS of the n-channel MOS field effect transistor Q0 under conditions of variations in gate voltage level of the n-channel MOS field effect transistor Q0 as well as illustrative of a load curve of the load RL connected to the drain of the n-channel MOS field effect transistor Q0 in the second novel slew rate output circuit of FIG. 5.

FIG. 8 is a diagram illustrative of a drain current ID of the n-channel MOS field effect transistor Q0 over a drain voltage Vds of the n-channel MOS field effect transistor Q0 under conditions of variations in gate voltage level of the n-channel MOS field effect transistor Q0 as well as illustrative of a load curve of the load RL connected to the drain of the n-channel MOS field effect transistor Q0 in the second novel slew rate output circuit. If the gate voltage Vgs of the n-channel MOS field effect transistor Q0 is decided or fixed, then a point on the load curve is also decided, whereby the drain voltage Vds and the drain current ID are founded. Even if the gate voltage Vgs becomes not less than 2.5V, then also no variation Appears on the output current. Assuming that the power voltage level Vcc is 5V, a variation of the gate voltage level Vgate from 5V to 2.5V causes almost no variation of the output current Iout, whereby the delay time becomes long. If, under the gate voltage level Vgs of not higher than 2.5V, the fourth n-channel MOS field effect transistor Q21 turn ON or OFF, then a large variation appears on the output current of the n-channel MOS field effect transistor Q0. Namely, if "y" becomes large, then the delay time becomes long. If "y" becomes small, then the variation in output current of the n-channel MOS field effect transistor Q0 in ON-OFF switching becomes large. In order to shorten the delay time and also suppress the variation in output current of the n-channel MOS field effect transistor Q0 within 10% in the ON-OFF switching of the fourth n-channel MOS field effect transistor Q21, it is required that "y" is in the range of 90–99%, preferably 95–99%.

It is preferable that the first and second reference voltage levels Vr1 and Vr2 are supplied by first and second reference voltage generator circuits to set accurate reference voltage levels.

With reference to the gate voltage level Vgate of the n-channel MOS field effect transistor Q0, the timings of switching the third p-channel MOS field effect transistor Q11 and the fourth n-channel MOS field effect transistor Q21 are decided so that variation in delay time is well suppressed.

In accordance with the present invention, during the predetermined time period after the transition in voltage level of the input pule signal has appeared, the driving capability of the output n-channel MOS field effect transistor Q0 is set high to shorten the delay times for turning the output n-channel MOS field effect transistor Q0 ON or OFF, and further after the time has passed the predetermined time period, the driving capability of the output n-channel MOS field effect transistor Q0 is set low to relax the rising and falling times of the output waveform, whereby the required slew rate function can be obtained.

Further, in accordance with the present invention, the driving capability is switched from the high level to the low level before the output n-channel MOS field effect transistor Q0 turns ON, so that there can be obtained the output waveform free from substantially no noise due to the switching the driving capability.

Figure 9:
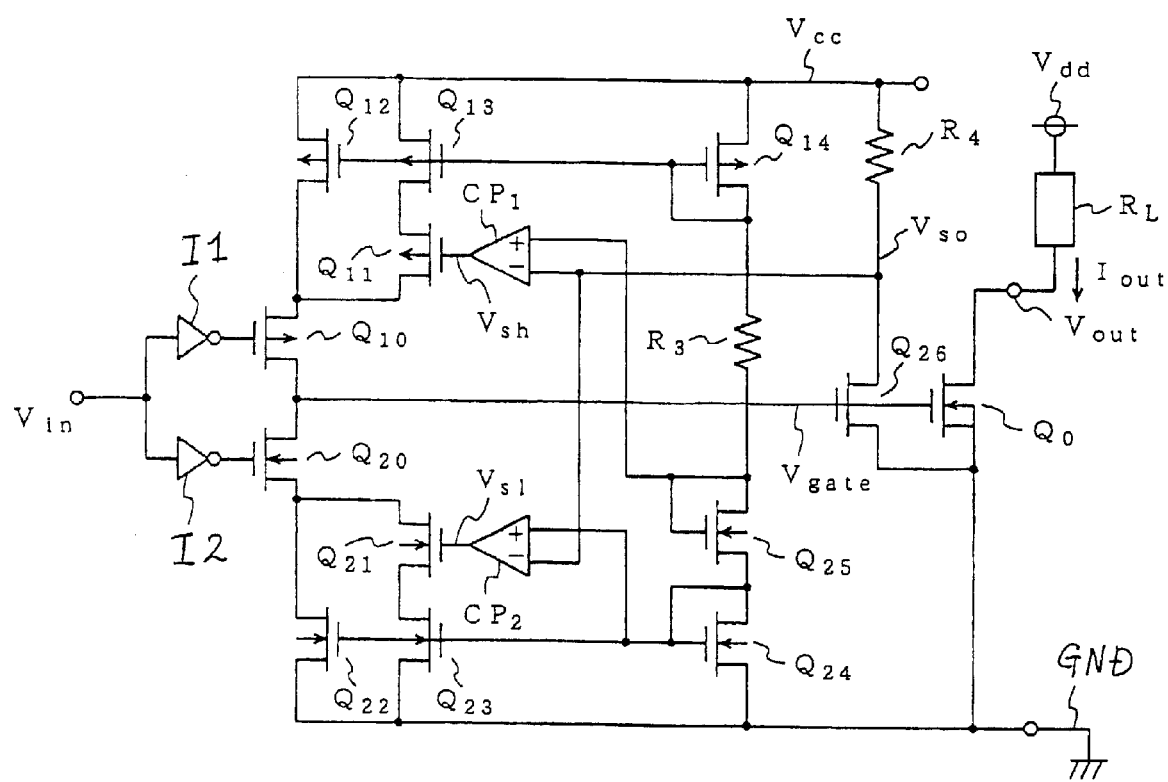
FIG. 9 is a circuit diagram illustrative of a third novel open-drain type slew rate output circuit in a third embodiment in accordance with the present invention.

A third embodiment according to the present invention will be described in detail with reference to the drawings. FIG. 9 is a circuit diagram illustrative of a third novel open-drain type slew rate output circuit. The third novel slew rate output circuit has an n-channel output MOS field effect transistor Q0 connected in series between a ground line and an output terminal on which an output signal Vout appears. A load RL is also connected between the output terminal and a first power voltage line Vdd. Namely, the load RL and the n-channel output MOS field effect transistor Q0 are connected in series between the first power voltage line Vdd and the ground line, and the output terminal is connected between the load RL and the n-channel output MOS field effect transistor Q0. A source of the n-channel output MOS field effect transistor Q0 is connected to the ground line, whilst a drain of the n-channel output MOS field effect transistor Q0 is connected to the output terminal which is further connected through the load RL to the first power voltage line Vdd.

The third novel slew rate output circuit also has a first driver circuit performing a first driving capability and a second driver circuit performing a second driving capability, as well as a first control circuit connected to the first driver circuit for controlling the first driver circuit and a second control circuit connected to the second driver circuit for controlling the second driver circuit so that, in a predetermined time period, both the first and second driver circuits are operated, and in the remaining time period, only the first driver circuit is operated. The first driver circuit comprises a first series connection of a fifth p-channel MOS field effect transistor Q12 and a first p-channel MOS field effect transistor Q10 between a second power voltage line Vcc and a gate of the output n-channel MOS field effect transistor Q0 as well as a sixth n-channel MOS field effect transistor Q22 and a second n-channel MOS field effect transistor Q20 between the ground line and the gate of the output n-channel MOS field effect transistor Q0. The second driver circuit comprises a third series connection of a seventh p-channel MOS field effect transistor 013, a third p-channel MOS field effect transistor Q11 and the first p-channel MOS field effect transistor Q10 between the second power voltage line Vcc and the gate of the output n-channel MOS field effect transistor Q0 as well as a fourth series connection of an eighth n-channel MOS field effect transistor Q23, a fourth n-channel MOS field effect transistor Q21 and the second n-channel MOS field effect transistor Q20 between the ground line and the gate of the output n-channel MOS field effect transistor Q0. The first and second control circuits do control the first p-channel, second n-channel, third p-channel, fourth n-channel, fifth p-channel, sixth n-channel, seventh p-channel and eighth n-channel MOS field effect transistors Q10, Q20, Q11, Q21, Q12, Q22, 013, and Q23. The first control circuit comprises first and second subordinate first control circuits. The first subordinate first control circuit is connected between the input terminal and gates of the first p-channel and second n-channel MOS field effect transistors Q10 and 020 for controlling ON-OFF operations of the first p-channel and second n-channel MOS field effect transistors Q10 and Q20 The second subordinate first control circuit is connected between the second power voltage line Vcc and the ground line as well as connected to gates of the fifth p-channel and sixth n-channel MOS field effect transistors Q12 and Q22. The second control circuit is connected between the gate of the output n-channel MOS field effect transistor Q0 and gates of the third p-channel and fourth n-channel MOS field effect transistors Q11 and Q21 for controlling ON-OFF operations of the third p-channel and fourth n-channel MOS field effect transistors Q11 and Q21. The first subordinate first control circuit comprises a first invertor circuit I1 having an input side connected to the input terminal and an output side connected to the gate of the first p-channel MOS field effect transistor Q10 and a second invertor circuit I2 having an input side connected to the input terminal and an output side connected to the gate of the second n-channel MOS field effect transistor Q20 The second subordinate first control circuit comprises a third series connection of a seventh p-channel MOS field effect transistor Q14, a first resistance R3, a ninth n-channel MOS field effect transistor Q25, and an n-channel MOS field effect transistor Q24 between the second power voltage line Vcc and the ground line. The seventh p-channel MOS field effect transistor Q14 has a gate connected to the gates of the fifth and seventh p-channel MOS field effect transistors Q12 and Q13. The seventh p-channel MOS field effect transistor Q14 also has a drain connected to the gate thereof and also connected to the first resistance R3. The seventh p-channel MOS field effect transistor Q14 also has a source connected to the second power voltage line Vcc. The first resistance R3 is connected between the drain of the seventh p-channel MOS field effect transistor Q14 and the gate of the output n-channel MOS field effect transistor Q0. The ninth n-channel MOS field effect transistor Q25 has a gate connected to a drain thereof and also connected to the gate of the output n-channel MOS field effect transistor Q0. The ninth n-channel MOS field effect transistor Q25 has a source connected to a drain of the eighth n-channel MOS field effect transistor Q24. The eighth n-channel MOS field effect transistor Q24 has a gate connected to the drain thereof and also connected to the source of the ninth n-channel MOS field effect transistor Q25 as well as connected to gates of the sixth and eighth n-channel MOS field effect transistors Q22 and Q23. The eighth n-channel MOS field effect transistor Q24 also has a source connected to the ground line. The second control circuit comprises a first comparator CP1 having a positive input connected to the gate of the output n-channel MOS field effect transistor Q0 and a negative input connected to a reference voltage generator circuit and an output connected to a gate of the third p-channel MOS field effect transistor Q11 for controlling the ON-OFF operations of the third p-channel MOS field effect transistor Q11 in accordance with a first comparison signal Vsh from the first comparator CP1 as well as a second comparator CP2 having a positive input connected to the gate of the eighth n-channel MOS field effect transistor Q24 and a negative input connected to the reference voltage generator circuit and an output connected to a gate of the fourth n-channel MOS field effect transistor Q21 for controlling the ON-OFF operations of the third n-channel MOS field effect transistor Q21 in accordance with a second comparison signal Vsl from the second comparator CP2. The reference voltage generator circuit comprises a fourth series connection of a second resistance R4 and a tenth n-channel MOS field effect transistor Q26. The second resistance R4 is connected between the second power voltage line Vcc and the individual negative inputs of the first and second comparators CP1 and CP2. The tenth n-channel MOS field effect transistor Q26 has a gate connected to the gate of the output n-channel MOS field effect transistor Q0. The tenth n-channel MOS field effect transistor Q26 also has a source connected to the second resistance R4. The tenth n-channel MOS field effect transistor Q26 also has a drain connected to the drain of the output n-channel MOS field effect transistor Q0 and also connected to the ground line. An intermediate point between the source of the tenth n-channel MOS field effect transistor Q26 and the second resistance R4 is connected to the individual negative inputs of the first and second comparators CP1 and CP2 for supplying the reference voltage to the individual negative inputs of the first and second comparators CP1 and CP2.

As described above, the third novel slew rate output circuit has an n-channel output MOS field effect transistor Q0 connected in series between a ground line and an output terminal on which an output signal Vout appears. The timing of switching the driving current of the output n-channel MOS field effect transistor Q0 is decided by detecting a current proportional to a current flowing through the load RL. In place of the four constant current sources CS10, CS20, CS11 and CS21 of the second novel slew rate output circuit, the four constant current sources of this third novel slew rate output circuit comprise MOS field effect transistors Q12, Q22. Q13 and Q23 respectively The first and second reference voltage levels Vr1 and Vr2 for the first and second comparators CP1 and CP2 of the third novel slew rate output circuit are decided by utilizing the threshold voltage of the MOS field effect transistor.

Namely, a series connection of a resistance R4 and an n-channel MOS field effect transistor Q26 is connected between the second power voltage line Vcc and the ground line so that the resistance R4 and the n-channel MOS field effect transistor Q26 are parallel to the load RL and the output n-channel MOS field effect transistor Q0. The n-channel MOS field effect transistor Q26 has a gate connected to the gate of the output n-channel MOS field effect transistor Q0 so that the n-channel MOS field effect transistor Q26 and the output n-channel MOS field effect transistor Q0 are concurrently driven. The n-channel MOS field effect transistor 026 also has a drain connected to the drain of the output n-channel MOS field effect transistor Q0. The n-channel MOS field effect transistor Q26 also has a similar figure to the output n-channel MOS field effect transistor Q0, wherein a ratio in channel width of the output n-channel MOS field effect transistor Q0 to the n-channel MOS field effect transistor Q26 is A:1. A small current Iout/A proportional to the output current Iout flows through the resistance R4. A voltage VSO of the connecting point between the resistance R4 and the n-channel MOS field effect transistor Q26 is given by VSO=Vcc−Iout/A×R4. This connecting point is connected to the individual negative inputs of the first and second comparators CP1 and CP2 so as to form a equivalent circuitry to what the gate voltage Vgate of the output n-channel MOS field effect transistor Q0 is connected to the individual positive inputs of the first and second comparators as shown in FIG.5.

The p-channel MOS field effect transistors Q12, Q13 and Q14 forms a current mirror circuit as a constant current circuit. The n-channel MOS field effect transistors Q22, Q23 and Q24 forms another current mirror circuit as a constant current circuit. If the gate-drain voltages of the p-channel MOS field effect transistor Q14 and the n-channel MOS field effect transistors Q24 and Q25 are defined to be Vtp and Vtn, a reference current Iconst flowing through the resistance R3 is given by Iconst=(Vcc−Vtp−2Vtn)/R3. If the p-channel MOS field effect transistors Q12, Q13 are in the ON-state, then individual currents flowing through the p-channel MOS field effect transistors Q12, Q13 arc proportional to the reference current Iconst. If the n-channel MOS field effect transistors Q22, Q23 are in the ON-state, then individual currents flowing through the n-channel MOS field effect transistors Q22, Q23 are proportional to the reference current Iconst. Individual currents flowing through the p-channel MOS field effect transistors Q12, Q13 may be controlled by changing the ratio in area of the p-channel MOS field effect transistors Q12, Q13 to the p-channel MOS field effect transistor Q14. Individual currents flowing through the n-channel MOS field effect transistors Q22, Q23 may be controlled by changing the ratio in area of the n-channel MOS field effect transistors Q22, Q23 to the n-channel MOS field effect transistor Q24.

The series connections of the p-channel MOS field effect transistor Q14, the resistance R3 and the n-channel MOS field effect transistors Q25, Q24 divides the voltage Vcc between the second power voltage line Vcc and the ground line so that the first and second reference voltage levels are supplied to the individual positive inputs of the first and second comparators CP1 and CP2 Namely, the first reference voltage level of the first comparator CP1 corresponds to the gate voltage level of the n-channel MOS field effect transistor Q25. The second reference voltage level of the second comparator CP2 corresponds to the gate voltage level of the n-channel MOS field effect transistor Q24.

Further, the voltage inputted to the individual negative inputs of the first and second comparators CP1 and CP2 for comparison with the first and second reference voltage levels has a phase inversion to the n-channel MOS field effect transistor Q26 laid out in the vicinity of the output nchannel MOS field effect transistor Q0, for which reason the threshold voltage of the n-channel MOS field effect transistor Q26 is likely to follow variation in the threshold voltage of the output n-channel MOS field effect transistor Q0, whereby the switching point or timing of the driving current can be compensated to ensure a highly stable operation of the slew rate output circuit.

In this third embodiment, the first and second reference voltages Vr1 and Vr2 and the reference current Iconst for the current mirror are supplied by the same transistors Q14, Q24 and Q25. As a modification to this, it is possible that the different transistors may supply the first and second reference voltages Vr1 and Vr2 and the reference current Iconst for the current mirror.

It is also possible as a further modification that the first and second reference voltages Vr1 and Vr2 is generated by a band gap type reference voltage generator circuit whilst the reference current Iconst is generated by a band gap type reference voltage generator circuit.

In accordance with this embodiment, the small current proportional to the output current Iout of the output n-channel MOS field effect transistor Q0 is detected to control the switching points or timings of the third p-channel MOS field effect transistor Q11 and the fourth n-channel MOS field effect transistor Q21 so as to suppress variations of the delay time due to variations in the threshold voltages of the output n-channel MOS field effect transistor Q0.

In accordance with the present invention, during the predetermined time period after the transition in voltage level of the input pule signal has appeared, the driving capability of the output n-channel MOS field effect transistor Q0 is set high to shorten the delay times for turning the output n-channel MOS field effect transistor Q0 ON or OFF, and further after the time has passed the predetermined time period, the driving capability of the output n-channel MOS field effect transistor Q0 is set low to relax the rising and falling times of the output waveform, whereby the required slew rate function can be obtained.

Further, in accordance with the present invention, the driving capability is switched from the high level to the low level before the output n-channel MOS field effect transistor Q0 turns ON, so that there can be obtained the output waveform free from substantially no noise due to the switching the driving capability.

Figure 10:
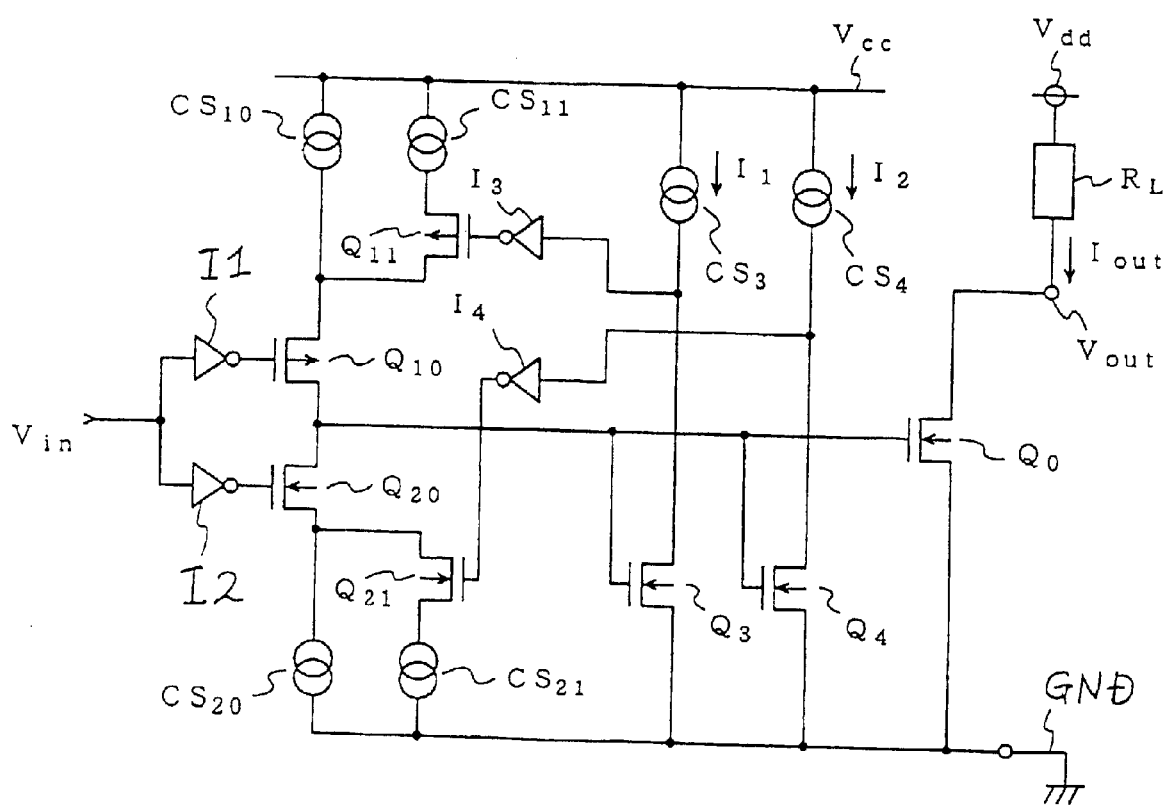
FIG. 10 is a circuit diagram illustrative of a fourth novel open-drain type slew rate output circuit in a fourth embodiment in accordance with the present invention.

A fourth embodiment according to the present invention will be described in detail with reference to the drawings. FIG. 10 is a circuit diagram illustrative of a fourth novel open-drain type slew rate output circuit. The fourth novel slew rate output circuit has an n-channel output MOS field effect transistor Q0 connected in series between a ground line and an output terminal on which an output signal Vout appears. A load RL is also connected between the output terminal and a first power voltage line Vdd Namely, the load RL and the n-channel output MOS field effect transistor Q0 are connected in series between the first power voltage line Vdd and the ground line, and the output terminal is connected between the load RL and the n-channel output MOS field effect transistor Q0. A source of the n-channel output MOS field effect transistor Q0 is connected to the ground line, whilst a drain of the n-channel output MOS field effect transistor Q0 is connected to the output terminal which is further connected through the load RL to the first power voltage line Vdd.

The fourth novel slew rate output circuit also has a first driver circuit performing a first driving capability and a second driver circuit performing a second driving capability, as well as a first control Circuit connected to the first driver circuit for controlling the first driver circuit and a second control circuit connected to the second driver circuit for controlling the second driver circuit so that, in a predetermined time period, both the first and second driver circuits are operated, and in the remaining time period, only the first driver circuit is operated. The first driver circuit comprises a first series connection of a first constant current source CS10 for supplying a first constant current and a first p-channel MOS field effect transistor Q10 between a second power voltage line Vcc and a gate of the output n-channel MOS field effect transistor Q0 as well as a second series connection of a second constant current source CS20 for supplying a second constant current and a second n-channel MOS field effect transistor Q20 between the ground line and the gate of the output n-channel MOS field effect transistor Q0. The second driver circuit comprises a third series connection of a third constant current source CS11 for supplying a third constant current, a third p-channel MOS field effect transistor Q11 and the first p-channel MOS field effect transistor Q10 between the second power voltage line Vcc and the gate of the output n-channel MOS field effect transistor Q0 as well as a fourth series connection of a fourth constant current source CS21 for supplying a second constant current, a fourth n-channel MOS field effect transistor Q21 and the second n-channel MOS field effect transistor Q20 between the ground line and the gate of the output n-channel MOS field effect transistor Q0. The first and second control circuits do control the first p-channel, second n-channel, third p-channel and fourth n-channel MOS field effect transistors Q10, Q20, Q11 and Q21. The first control circuit is connected between the input terminal and gates of the first p-channel and second n-channel MOS field effect transistors Q10 and Q20 for controlling ON-OFF operations of the first p-channel and second n-channel MOS field effect transistors Q10 and Q20. The second control circuit is connected between the gate of the output n-channel MOS field effect transistor Q0 and gates of the third p-channel and fourth n-channel MOS field effect transistors Q11 and Q21 for controlling ON-OFF operations of the third p-channel and fourth n-channel MOS field effect transistors Q11 and Q21. The first control circuit comprises a first invertor circuit I1 having an input side connected to the input terminal and an output side connected to the gate of the first p-channel MOS field effect transistor Q10 and a second invertor circuit I2 having an input side connected to the input terminal and an output side connected to the gate of the second n-channel MOS field effect transistor Q20. The second control circuit comprises a first comparator and a second comparator CP2. The first comparator comprises a third invertor I3 and a third series connection of a fifth constant current source CS3 and a fifth n-channel MOS field effect transistor Q3 between the second power voltage line Vcc and the ground line. The fifth constant current source CS3 is connected between the second power voltage line Vcc and a source of the fifth constant current source CS3 for supplying a first constant current value I1. The fifth n-channel MOS field effect transistor Q3 has a gate connected to the gate of the output n-channel MOS field effect transistor Q0. The fifth n-channel MOS field effect transistor Q3 also has a source connected to the ground line The fifth n-channel MOS field effect transistor Q3 also has a drain connected to the fifth constant current source CS3. The third invertor I3 has an input connected to an intermediate point between the drain of the fifth n-channel MOS field effect transistor Q3 and the fifth constant current source CS3. The third invertor I3 also has an output connected to the gate of the third p-channel MOS field effect transistor Q11. The second comparator comprises a fourth invertor I4 and a fourth series connection of a sixth constant current source CS4 and a sixth n-channel MOS field effect transistor Q4 between the second power voltage line Vcc and the ground line. The sixth constant current source CS4 is connected between the second power voltage line Vcc and a source of the sixth constant current source CS4 for supplying a second constant current value I2. The sixth n-channel MOS field effect transistor Q4 has a gate connected to the gate of the output n-channel MOS field effect transistor Q0. The sixth n-channel MOS field effect transistor Q4 also has a source connected to the ground line. The sixth n-channel MOS field effect transistor Q4 also has a drain connected to the sixth constant current source CS4. The fourth invertor I4 has an input connected to an intermediate point between the drain of the sixth n-channel MOS field effect transistor Q4 and the sixth constant current source CS4. The fourth invertor I4 also has an output connected to the gate of the fourth n-channel MOS field effect transistor Q21.

In accordance with the fourth novel slew rate output circuit, for the purpose of two times switching of the driving current, there are provided two constant current sources CS3 and CS4, two n-channel MOS field effect transistors Q3 and Q4 for controlling the two constant current sources CS3 and CS4, and two invertors I3 and I4 connecting outputs of the two constant current sources CS3 and CS4 to two constant current sources CS11 and CS12. The n-channel MOS field effect transistors Q3 and Q4 have similar configures to the output n-channel MOS field effect transistor Q0 so that a ratio in channel width of the output n-channel MOS field effect transistor Q0 to the n-channel MOS field effect transistors Q3 and Q4 is A:1. The n-channel MOS field effect transistors Q3 and Q4 have gates connected to the gate of the output n-channel MOS field effect transistor Q0. The n-channel MOS field effect transistors Q3 and Q4 also have drains connected to the drains of the output n-channel MOS field effect transistor Q0. A small current of A×Iout proportional to the output current flows through the n-channel MOS field effect transistors Q3 and Q4.

The constant current sources CS3 and CS4 supply the constant currents I1 and I2 which are set to satisfy the following equations.

$$AI1 = Im \times X$$

$$AI2 = Im \times Y$$

where "Im" is the amplitude of the output current Iout when the output n-channel MOS field effect transistor Q0 and a ratio in channel width of the n-channel MOS field effect transistors Q3 and Q4 to the output n-channel MOS field effect transistor Q0 is 1:A. In order to suppress the variations in output current of the output n-channel MOS field effect transistor Q0, it is required that "X" is in the range of 0.01–0.10 and "Y" is in the range of 0.90–0.99, and preferably "X" is in the range of 0.01–0.05 and "Y" is in the range of 0.95–0.99.

During when the input pulse signal Vin in the low level, the first p-channel MOS field effect transistor Q10 remains OFF state whilst the second n-channel MOS field effect transistor Q20 remains ON state whereby the gate voltage of the output n-channel MOS field effect transistor Q0 remains low level, and also the n-channel MOS field effect transistors Q3 and 04 remain OFF states. Therefore, individual outputs from the constant current sources CS3 and CS4 become high voltage levels, whereby the third p-channel MOS field effect transistor Q11 remains ON-state whilst the n-channel MOS field effect transistor Q21 remains OFF-state.

When the transition of the input pulse signal Vin from the low level to the high level appears, the first p-channel MOS field effect transistor Q10 turns ON whilst the second n-channel MOS field effect transistor Q20 turns OFF, whereby the output n-channel MOS field effect transistor Q0 is driven by both the first constant current from the first constant current source CS10 and the third constant current from the third constant current source CS11. As a result, the input capacitance of the output n-channel MOS field effect transistor Q0 is rapidly charged by both the first constant current through the first constant current source CS10 and the third constant current through the third constant current source CS11. The gate voltage level Vgate of the output n-channel MOS field effect transistor Q0 is increased whereby the n-channel MOS field effect transistors Q3 and Q4 turn ON, whereby the individual currents from the constant current sources CS3 and CS4 begin to flow. When the current flowing through the n-channel MOS field effect transistor Q3 becomes higher than the current I1 of the constant current source CS3, then the input of the invertor I3 becomes low level. The third p-channel MOS field effect transistor Q11 turns OFF before the output n-channel MOS field effect transistor Q0 is driven by only the first constant current through the first constant current source CS10. When the gate voltage level Vgate of the output n-channel MOS field effect transistor Q0 is further increased to increase the output current Iout so that the current flowing through the fourth n-channel MOS field effect transistor Q4 becomes higher than the current I2 of the constant current source CS4, then the input of the invertor I4 becomes low level. The fourth p-channel MOS field effect transistor Q21 turns ON.

When the transition of the input pulse signal Vin from the high level to the low level appears, the p-channel MOS field effect transistor Q10 turns OFF whilst the second n-channel MOS field effect transistor Q20 turns ON. The input capacitance of the output n-channel MOS field effect transistor Q0 is rapidly discharged by both the second constant current through the second constant current source CS20 and the fourth constant current through the fourth constant current source CS21. The gate voltage level Vgate of the output n-channel MOS field effect transistor Q0 is decreased so that the fourth constant current from the fourth constant current source CS4 becomes the constant current source CS4, whereby the fourth n-channel MOS field effect transistor turns OFF before the output n-channel MOS field effect transistor Q0 is driven by only the second constant current through the second constant current source CS20.

Even if the threshold voltage of the output n-channel MOS field effect transistor Q0 is varied in the manufacturing processes, variations in switching point or timing of the third p-channel MOS field effect transistor Q11 and the n-channel MOS field effect transistor Q21 can be suppressed thereby suppressing the variation of the delay time. The switching point or timing of the third p-channel MOS field effect transistor Q11 depends upon a ratio in channel width of the output n-channel MOS field effect transistor Q0 to the n-channel MOS field effect transistor Q3 and a current value I1 from the constant current source CS3. A variation in ratio in channel width of the output n-channel MOS field effect transistor Q0 to the n-channel MOS field effect transistor Q3 can be suppressed by laying out the n-channel MOS field effect transistor Q3 in the vicinity of the output n-channel MOS field effect transistor Q0. The constant current sources CS3 and CS11 form the current mirror circuit for the purpose of having the same current source so that the tendency of the variation is uniform direction. For example, if the constant current source CS3 is varied to become large, then the constant current source CS11 is also varied to become large. If the current value I1 from the constant current source CS3 is varied to become large, then the third p-channel MOS field effect transistor Q11 remains unswitched until a large current flows through the p-channel MOS field effect transistor Q3, whereby the switching point or timing is delayed. However, the third p-channel MOS field effect transistor Q11 is also varied to become large, for which reason the current for driving the input capacitance of the output n-channel MOS field effect transistor Q0 is also increased to rapidly charge the input capacitance of the output n-channel MOS field effect transistor Q0. As a result, even if the constant currents from the constant current sources CS3 and CS11 are varied, the variation in delay time can be suppressed.

In accordance with the present invention, during the predetermined time period after the transition in voltage level of the input pule signal has appeared, the driving capability of the output n-channel MOS field effect transistor Q0 is set high to shorten the delay times for turning the output n-channel MOS field effect transistor Q0 ON or OFF, and further after the time has passed the predetermined time period, the driving capability of the output n-channel MOS field effect transistor Q0 is set low to relax the rising and falling times of the output waveform, whereby the required slew rate function can be obtained.

Further, in accordance with the present invention, the driving capability is switched from the high level to the low level before the output n-channel MOS field effect transistor Q0 turns ON, so that there can be obtained the output waveform free from substantially no noise due to the switching the driving capability.

Figure 11:
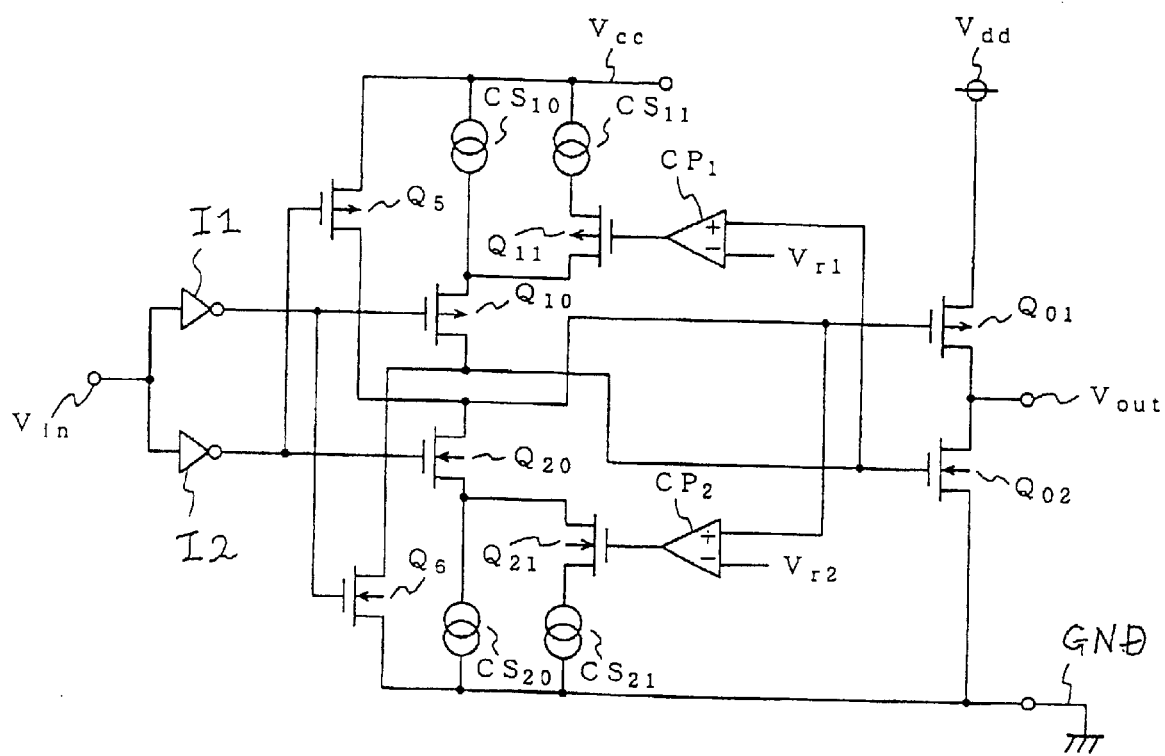
FIG. 11 is a circuit diagram illustrative of a fifth novel open-drain type slew rate output circuit in a fifth embodiment in accordance with the present invention.

A fifth embodiment according to the present invention will be described in detail with reference to the drawings. FIG. 11 is a circuit diagram illustrative of a fifth novel open-drain type slew rate output circuit. The second novel slew rate output circuit has a CMOS circuit connected between a ground line and an output terminal on which an output signal Vout appears. The CMOS circuit comprises a series connection of a first output p-channel MOS field effect transistor Q01 and a second output n-channel MOS field effect transistor Q02. The first output p-channel MOS field effect transistor Q01 has a source connected to a first power voltage line Vdd and a drain connected to the output terminal of the fifth novel slew rate output circuit. The second output n-channel MOS field effect transistor Q02 has a source connected to a ground line and a drain connected to the output terminal of the fifth novel slew rate output circuit.

The second novel slew rate output circuit also has a first driver circuit performing a first driving capability and a second driver circuit performing a second driving capability as well as a first control circuit connected to the first driver circuit for controlling the first driver circuit and a second control circuit connected to the second driver circuit for controlling the second driver circuit so that, in a predetermined time period, both the first and second driver circuits arc operated, and in the remaining time period, only the first driver circuit is operated. The first driver circuit comprises a first series connection of a first constant current source CS10 for supplying a first constant current and a first p-channel MOS field effect transistor Q10 between a second power voltage line Vcc and a gate of the second output n-channel MOS field effect transistor Q02 of the CMOS circuit as well as a second series connection of a second constant current source CS20 for supplying a second constant current and a second Bchannel MOS field effect transistor Q20 between the ground line and the gate of the first output p-channel MOS field effect transistor Q01 of the CMOS circuit. The second driver circuit comprises a third series connection of a third constant current source CS11 for supplying a third constant current, a third p-channel MOS field effect transistor Q11 and the first p-channel MOS field effect transistor Q10 between the second power voltage line Vcc and the gate of the second output n-channel MOS field effect transistor Q02 of the CMOS circuit as well as a fourth series connection of a fourth constant current source CS21 for supplying a second constant current, a fourth n-channel MOS field effect transistor Q21 and the second n-channel MOS field effect transistor Q20 between the ground line and the gate of the first output p-channel MOS field effect transistor Q01 of the CMOS circuit. The first and second control circuits do control the first p-channel, second n-channel, third p-channel and fourth n-channel MOS field effect transistors Q10, Q20, Q11 and Q21. The first control circuit is connected between the input terminal and gates of the first p-channel and second n-channel MOS field effect transistors Q10 and Q20 for controlling ON-OFF operations of the first p-channel and second n-channel MOS field effect transistors Q10 and Q20. The second control circuit is connected between the gates of the first and second output p-channel and n-channel MOS field effect transistors Q01 and Q02 of the CMOS circuit and gates of the third p-channel and fourth n-channel MOS field effect transistors Q11 and Q21 for controlling ON-OFF operations of the third p-channel and fourth n-channel MOS field effect transistors Q11 and Q21. The first control circuit comprises a first invertor circuit I1 having an input side connected to the input terminal and an output side connected to the gate of the first p-channel MOS field effect transistor Q10 and a second invertor circuit I2 having an input side connected to the input terminal and an output side connected to the gate of the second n-channel MOS field effect transistor Q20. The second control circuit comprises a first comparator CP1 having a positive input connected to the gate of the second output n-channel MOS field effect transistor Q02 of the CMOS circuit and a negative input receiving a first reference voltage Vr1 and an output connected to a gate of the third p-channel MOS field effect transistor Q11 for controlling the ON-OFF operations of the third p-channel MOS field effect transistor Q11 in accordance with a first comparison signal Vsh from the first comparator CP1 as well as a second comparator CP2 having a positive input connected to the gate of the first output p-channel MOS field effect transistor Q01 of the CMOS circuit and a second input receiving a second reference voltage Vr2 and an output connected to a gate of the fourth n-channel MOS field effect transistor Q21 for controlling the ON-OFF operations of the third n-channel MOS field effect transistor Q21 in accordance with a second comparison signal Vsl from the second comparator CP2. Further, a fifth p-channel MOS field effect transistor Q5 is provided which has a gate connected to the output of the second invertor I2 and a source connected to the second power voltage line Vcc. The fifth p-channel MOS field effect transistor Q5 also has a drain connected to the gate of the first output p-channel MOS field effect transistor Q01 of the CMOS circuit as well as connected to the drain of the second n-channel MOS field effect transistor Q20. A sixth n-channel MOS field effect transistor Q6 is provided which has a gate connected to the output of the first invertor I1 and a source connected to the ground line. The sixth n-channel MOS field effect transistor Q6 also has a drain connected to the gate of the second output n-channel MOS field effect transistor Q02 of the CMOS circuit as well as connected to the drain of the first p-channel MOS field effect transistor Q21.

In this embodiment, in pace of the output n-channel MOS field effect transistor Q0, a complementary MOS circuit is driven and an output terminal of the CMOS circuit serves as the output terminal of the first skew rate output circuit. The CMOS circuit comprises a series connection of a p-channel MOS field effect transistor Q01 and an n-channel MOS field effect transistor Q02 between the first power voltage line Vdd and the ground line.

A p-channel MOS field effect transistor Q5 is operated so that when an n-channel MOS field effect transistor Q02 is in the ON-state, a p-channel MOS field effect transistor Q01 turns OFF, whilst an n-channel MOS field effect transistor Q6 is operated so that when the p-channel MOS field effect transistor Q01 is in the ON-state, the n-channel MOS field effect transistor Q02 turns OFF, so as to prevent concurrent ON-state of the n-channel MOS field effect transistor Q02 and the p-channel MOS field effect transistor Q01 whereby a punch through current is prevented from flowing from the power voltage line to the ground line.

As a result, when the transition of the input pulse signal Vin from the low level to the high level appears, the n-channel MOS field effect transistor Q02 turns ON whilst the p-channel MOS field effect transistor Q01 turns OFF, whereby the output voltage Vout falls down. When the transition of the input pulse signal Vin from the high level to the low level appears, the n-channel MOS field effect transistor Q02 turns OFF whilst the p-channel MOS field effect transistor Q01 turns ON, whereby the output voltage Vout rises up.

In accordance with the present invention, during the predetermined time period after the transition in voltage level of the input pule signal has appeared, the driving capability of the output n-channel MOS field effect transistor Q0 is set high to shorten the delay times for turning the output n-channel MOS field effect transistor Q0 ON or OFF, and further after the time has passed the predetermined time period, the driving capability of the output n-channel MOS field effect transistor Q0 is set low to relax the rising and falling times of the output waveform, whereby the required slew rate function can be obtained.

Further, in accordance with the present invention, the driving capability is switched from the high level to the low level before the output n-channel MOS field effect transistor Q0 turns ON, so that there can be obtained the output waveform free from substantially no noise due to the switching the driving capability.

In the foregoing first to fifth embodiments in accordance with the present invention, the same type circuits are used for switching the first p-channel MOS field effect transistor Q11 and the n-channel MOS field effect transistor and for current detection It is however possible that different type circuits are used for the same purposes. For example, as a feed-back circuit, a detection is made with reference to the gate voltage Vgate of the n-channel MOS field effect transistor Q0 in turning the n-channel MOS field effect transistor Q0 ON whilst the detection is made with reference to the current Iout of the n-channel MOS field effect transistor Q0 in turning the n-channel MOS field effect transistor Q0 OFF.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A slew rate output circuit comprising:
   a switching device having at least an output field effect transistor and an output terminal;
   a driver circuitry connected to a gate of said output field effect transistor for driving said output field effect transistor; and
   a control circuitry connected to said driver circuitry for controlling a slew rate of said driver circuitry in accordance with an input signal so that, in a high speed charge-discharge first time period after a transition in level of said input signal, an average said slew rate is higher than an average slew rate in a second time period following the first time period.

2. A slew rate output circuit comprising:
a switching device having at least an output field effect transistor and an output terminal;
a driver circuitry connected to a gate of said output field effect transistor for driving said output field effect transistor; and
a control circuitry connected to said driver circuitry for controlling a slew rate of said driver circuitry in accordance with an input signal so that, in a high speed charge-discharge first time period after a transition in level of said input signal, an average said slew rate is higher than an average slew rate in a second time period following the first time period,
wherein said driver circuitry comprises a first driver having a first slew rate capability and a second driver having a second slew rate capability, and said control circuitry connected to both said first and second drivers for controlling said first and second drivers so that, in said high speed charge-discharge first time period, both said first and second drivers are operated, and in said second time period, only said first driver is operated.

3. The slew rate output circuit as claimed in claim 2, wherein said first driver comprises a first resistance connected in series between an input terminal to which said input signal is applied and said gate of said output field effect transistor, and said second driver comprises a first series connection of a first field effect transistor and a second resistance between a high voltage line and said gate electrode of said output field effect transistor and a second series connection of a second field effect transistor and a third resistance between a low voltage and said gate electrode of said output field effect transistor, and said control circuitry controls said first and second field effect transistors so that said first field effect transistor is activated for turning said output field effect transistor OFF whilst said second field effect transistor is activated for turning said output field effect transistor ON.

4. The slew rate output circuit as claimed in claim 3, wherein said control circuitry comprises a first control circuit connected between said input terminal and a gate of said first field effect transistor for controlling activation of said first field effect transistor and a second control circuit connected between said input terminal and a gate of said second field effect transistor for controlling activation of said second field effect transistor.

5. The slew rate output circuit as claimed in claim 4, wherein said first control circuit comprises a first delay circuit having an input side connected to said input terminal and an AND-gate having input sides connected to said input terminal and an output side of said delay circuit for performing an AND-operation of said input signal and a first delay signal from said first delay circuit, and said second control circuit comprises a second delay circuit having an input side connected to said input terminal and an OR-gate having input sides connected to said input terminal and an output side of said delay circuit for performing an OR-operation of said input signal and a second delay signal from said second delay circuit.

6. The slew rate output circuit as claimed in claim 2, wherein said first and second drivers comprise first and second constant current sources respectively and said control circuitry comprises a first field effect transistor connected in series between said first constant current source and said gate of said output field effect transistor, and a second field effect transistor connected in series between said second constant current source and said first field effect transistor so that said first field effect transistor controls a junction current of a first constant current through said first constant current source and a second constant current through said second constant current source and said second field effect transistor controls said second constant current.

7. The slew rate output circuit as claimed in claim 6, wherein said first and second constant current sources form a current mirror circuit.

8. The slew rate output circuit as claimed in claim 6, wherein control to said second field effect transistor is made by detecting a first current value corresponding to 1–10 percents of an amplification of a drain current of said output field effect transistor for turning said output field effect transistor ON, and detecting a second current value corresponding to 90–99 percents of said amplification of said drain current of said output field effect transistor for turning said output field effect transistor OFF.

9. The slew rate output circuit as claimed in claim 6, wherein said second field effect transistor has a gate connected to an output side of a comparator having a first input connected to said gate of said output field effect transistor for receiving a gate voltage of said output field effect transistor and a second input for receiving a reference voltage so as to perform a comparison of said gate voltage with said reference voltage so that said second field effect transistor is controlled by a comparison signal from said comparator.

10. The slew rate output circuit as claimed in claim 9, wherein control to said second field effect transistor is made by detecting a small current proportional to a drain current of said output field effect transistor and comparison of a voltage proportional to said small current and said reference voltage, and also comparison of said small current and a reference current.

11. The slew rate output circuit as claimed in claim 9, wherein said reference voltage is set to be a gate voltage level necessary for flowing a drain current corresponding to 1–10 percents of an amplification of said drain current of said output field effect transistor for turning said output field effect transistor ON, and to be a gate voltage level necessary for flowing a drain current corresponding to 1–10 percents of an amplification of said drain current of said output field effect transistor for turning said output field effect transistor OFF.

12. The slew rate output circuit as claimed in claim 1, wherein said switching device comprises a single output field effect transistor having a drain connected through a load to a power voltage line and a source connected to a ground line.

13. The slew rate output circuit as claimed in claim 1, wherein said switching device comprises a complementary MOS circuit which further comprises a p-channel MOS field effect transistor having a source connected to a power voltage line and an n-channel MOS field effect transistor having a source connected to a ground line and said output terminal is connected to both drains of said p-channel and n-channel MOS field effect transistors.

14. A slew rate circuit comprising:
a switching device connected to an output terminal;
a driver circuitry connected to said switching device for driving said switching device; and
a control circuitry connected to said driver circuitry for controlling a slew rate of said driver circuitry in accordance with an input signal so that, in a first time period after a transition in level of said input signal, an average said slew rate is higher than an average slew rate in a second time period following the first time period.

15. A slew rate circuit comprising:
a switching device connected to an output terminal;
a driver circuitry connected to said switching device for driving said switching device; and
a control circuitry connected to said driver circuitry for controlling a slew rate of said driver circuitry in accordance with an input signal so that, in a first time period after a transition in level of said input signal, an average said slew rate is higher than an average slew rate in a second time period following the first time period, wherein said driver circuitry comprises a first driver having a first slew rate capability and a second driver having a second slew rate capability, and said control circuitry connected to both said first and second drivers for controlling said first and second drivers so that, in said first time period, both said first and second drivers are operated, and in said second time period, only said first driver is operated.

16. The slew rate output circuit as claimed in claim 15, wherein said first driver comprises a first resistance connected in series between said switching device and an input terminal to which said input signal is applied, and said second driver comprises a first series connection of a first field effect transistor and a second resistance between a high voltage line and said switching device and a second series connection of a second field effect transistor and a third resistance between a low voltage and said switching device, and said control circuitry controls said first and second field effect transistors so that said first field effect transistor is activated for turning said switching device OFF whilst said second field effect transistor is activated for turning said switching device ON.

17. The slew rate output circuit as claimed in claim 16, wherein said control circuitry comprises a first control circuit connected between said input terminal and a gate of said first field effect transistor for controlling activation of said first field effect transistor and a second control circuit connected between said input terminal and a gate of said second field effect transistor for controlling activation of said second field effect transistor.

18. The slew rate output circuit as claimed in claim 17, wherein said first control circuit comprises a first delay circuit having an input side connected to said input terminal and an AND-gate having input sides connected to said input terminal and an output side of said delay circuit for performing an AND-operation of said input signal and a first delay signal from said first delay circuit, and said second control circuit comprises a second delay circuit having an input side connected to said input terminal and an OR-gate having input sides connected to said input terminal and an output side of said delay circuit for performing an OR-operation of said input signal and a second delay signal from said second delay circuit.

19. The slew rate output circuit as claimed in claim 15, wherein said first and second drivers comprise first and second constant current sources respectively and said control circuitry comprises a first field effect transistor connected in series between said first constant current source and said switching device, and a second field effect transistor connected in series between said second constant current source and said first field effect transistor so that said first field effect transistor controls a junction current of a first constant current through said first constant current source and a second constant current through said second constant current source and said second field effect transistor controls said second constant current.

20. The slew rate output circuit as claimed in claim 19, wherein said first and second constant current sources form a current mirror circuit.

21. The slew rate output circuit as claimed in claim 19, wherein control to said second field effect transistor is made by detecting a first current value corresponding to 1–10 percents of an amplification of a switching current of said switching device for turning said switching device ON, and detecting a second current value corresponding to 90–99 percents of said amplification of said switching current of said switching device for turning said switching device OFF.

22. The slew rate output circuit as claimed in claim 19, wherein said second field effect transistor has a gate connected to an output side of a comparator having a first input connected to said switching device for receiving a switching voltage of said switching device and a second input for receiving a reference voltage so as to perform a comparison of said switching voltage with said reference voltage so that said second field effect transistor is controlled by a comparison signal from said comparator.

23. The slew rate output circuit as claimed in claim 22, wherein control to said second field effect transistor is made by detecting a small current proportional to a switching current of said switching device and comparison of a voltage proportional to said small current and said reference voltage, and also comparison of said small current and a reference current.

24. The slew rate output circuit as claimed in claim 22, wherein said reference voltage is set to be a switching voltage level necessary for flowing a switching current corresponding to 1–10 percents of an amplification of said switching current of said switching device for turning said switching device ON, and to be a switching voltage level necessary for flowing a switching current corresponding to 1–10 percents of an amplification of said switching current of said switching device for turning said switching device OFF.

25. A slew rate circuit comprising:
a switching device connected to an output terminal;
a driver circuitry connected to said switching device for driving said switching device; and
a control circuitry connected to said driver circuitry for controlling a slew rate of said driver circuitry in accordance with an input signal so that, in a first time period after a transition in level of said input signal, an average said slew rate is higher than an average slew rate in a second time period following the first time period,
wherein said switching device comprises a single output field effect transistor having a drain connected through a load to a power voltage line and a source connected to a ground line.

26. A slew rate circuit comprising:
a switching device connected to an output terminal;
a driver circuitry connected to said switching device for driving said switching device; and
a control circuitry connected to said driver circuitry for controlling a slew rate of said driver circuitry in accordance with an input signal so that, in a first time period after a transition in level of said input signal, an average said slew rate is higher than an average slew rate in a second time period following the first time period,
wherein said switching device comprises a complementary MOS circuit which further comprises a p-channel MOS field effect transistor having a source connected to a power voltage line and an n-channel MOS field effect transistor having a source connected to a ground line and said output terminal is connected to both drains of said p-channel and n-channel MOS field effect transistors.

* * * * *